United States Patent
Hayakawa

(10) Patent No.: US 7,915,663 B2
(45) Date of Patent: Mar. 29, 2011

(54) FABRICATION AND METHOD OF OPERATION OF MULTI-LEVEL MEMORY CELL ON SOI SUBSTRATE

(75) Inventor: Yukio Hayakawa, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 679 days.

(21) Appl. No.: 11/493,468

(22) Filed: Jul. 25, 2006

(65) Prior Publication Data
US 2007/0018233 A1    Jan. 25, 2007

Related U.S. Application Data

(63) Continuation-in-part of application No. PCT/JP2005/013608, filed on Jul. 25, 2005.

(51) Int. Cl.
*H01L 27/07* (2006.01)
(52) U.S. Cl. .................. 257/316; 257/E27.103
(58) Field of Classification Search .................. 257/316, 257/E27.103
See application file for complete search history.

(56) References Cited

U.S. PATENT DOCUMENTS 5,696,718 A * 12/1997 Hartmann ................ 365/185.27
5,889,302 A *  3/1999 Liu ............................ 257/315

FOREIGN PATENT DOCUMENTS

| JP | 1120045    | 5/1989  |
| JP | 7074241    | 3/1995  |
| JP | 8213573    | 8/1996  |
| JP | 9074146    | 3/1997  |
| JP | 2003318289 | 11/2003 |

* cited by examiner

*Primary Examiner* — Thomas L Dickey

(57) ABSTRACT

A semiconductor device includes an insulation layer (14) provided on a semiconductor substrate (12), a p-type semiconductor region (16) provided on the insulation layer, an isolation region (18) provided that surrounds the p-type semiconductor region to reach the insulation layer, an n-type source region (20) and an n-type drain region (22) provided on the p-type semiconductor region, a charge storage region (30) provided above the p-type semiconductor region between the n-type source region and the n-type drain region, and an voltage applying portion that applies a different voltage to the p-type semiconductor region while any of programming, erasing and reading a different data of a memory cell that has the charge storage region is being preformed.

21 Claims, 15 Drawing Sheets

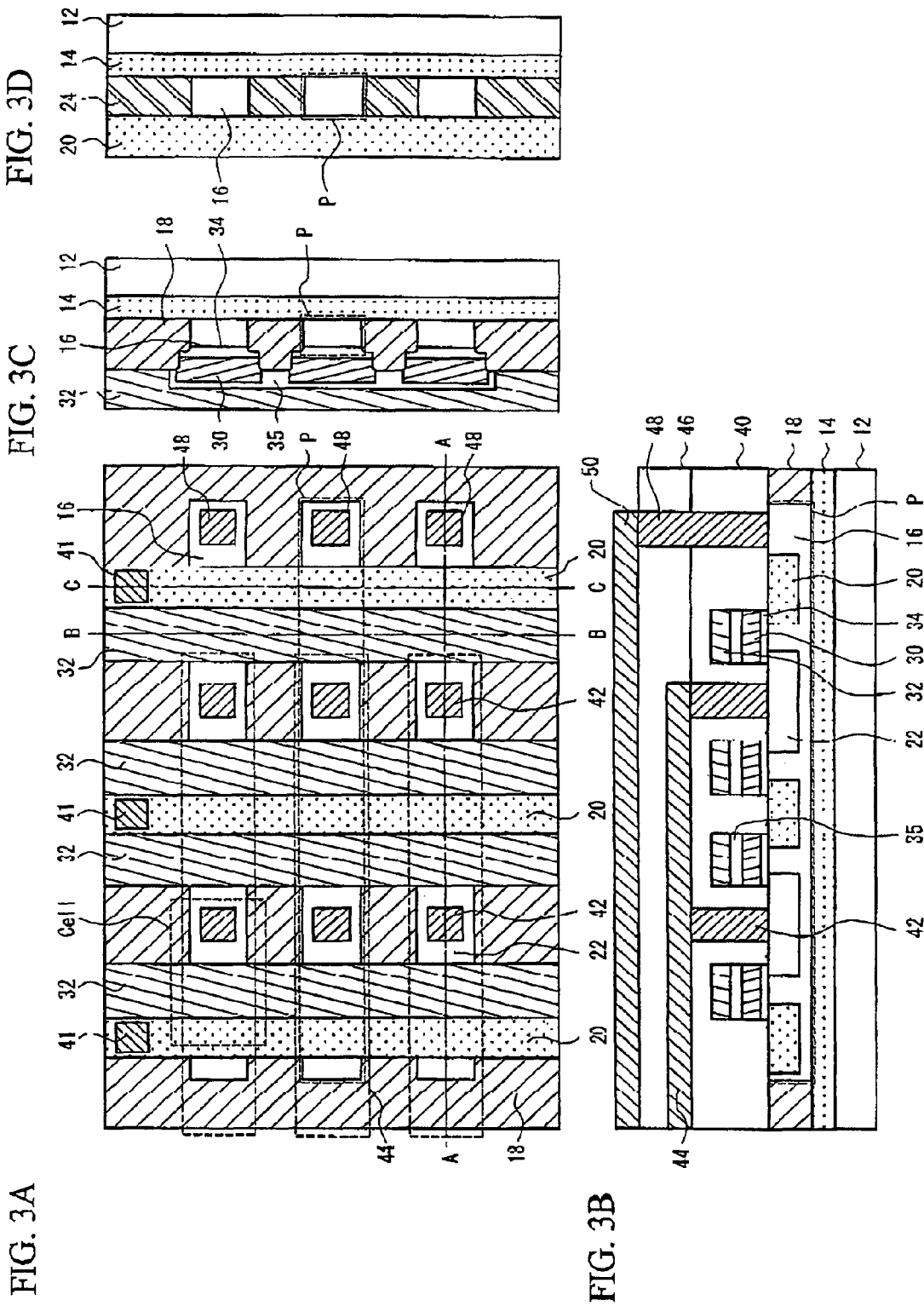

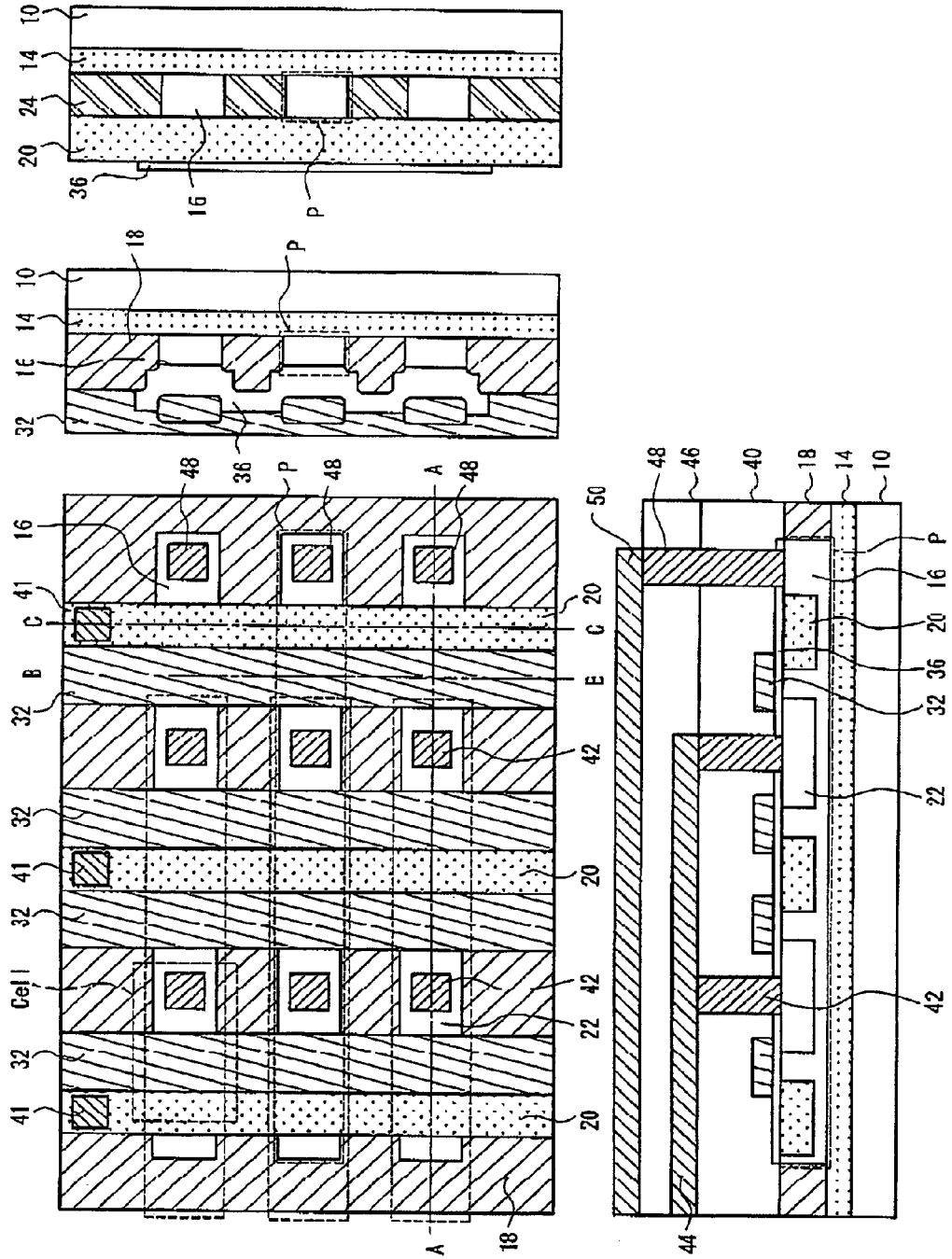

FABRICATION AND METHOD OF OPERATION OF MULTI-LEVEL MEMORY CELL ON SOI SUBSTRATE

CROSS-REFERENCES TO RELATED APPLICATIONS

This is a continuation in part of International Application No. PCT/JP2005/013608, filed Jul. 25, 2005 which was not published in English under PCT Article 21(2).

TECHNICAL FIELD

This invention relates generally to semiconductors and control methods therefor, and more particularly, to a semiconductor device in which multiple values are stored in a memory cell and a control method therefor.

BACKGROUND OF THE INVENTION

Description of the Related Art

In recent years, non-volatile memory of semiconductor devices, in which data is rewritable, have been widely used. In a flash memory that is a typical non-volatile memory, a transistor that composes a memory cell includes a floating gate or an insulation film, which is known as charge storage layer. Data is stored by storing charges in the charge storage layer.

In addition, to obtain higher storage capacity, there has been developed a flash memory in which multi-level data (multiple bits) is stored in a memory cell. A description will be given of a (conventional) flash memory in which a floating gate serves as a charge storage layer, with reference to FIG. 1A (Prior Art) and FIG. 1B. (Prior Art) FIG. 1A (Prior Art) is a schematic cross-sectional view of the transistor included in the memory cell of the flash memory of the conventional technique. FIG. 1B (Prior Art) is a view illustrating the principle of the multi-level memory cell. The horizontal axis represents threshold voltage (Vth), and the vertical axis represents the number of the memory cells having the threshold voltage Vth.

Referring to FIG. 1A (Prior Art), the transistor of the conventional flash memory includes a semiconductor substrate 60 in which a source 62 and a drain 64 are provided. Above the semiconductor substrate 60 between the source 62 and the drain 64, a floating gate 66 and a control gate 69 are provided. The floating gate 66 is surrounded by an insulation film such as a tunnel oxide film or the like, although the insulation film is not shown. Data is erased or written by storing the charges (electrons) in or extracting the charges (electrons) from the floating gate 66. The charge amount of the floating gate 66 changes the threshold voltage (Vth) of the transistor. At the time of reading, data is read out of the memory cell by reading Vth of the transistor. For example, the flash memory storing four-value data can be realized by providing, for example, four types of values available as Vth.

A description will now be given of a storage method of the multi-level data. Firstly, in erasing data, the source 62 and the drain 64 are opened, and a negative voltage (an example is −9 V) is applied to the control gate 68 as Vg and a positive voltage (an example is 9 V) is applied to the semiconductor substrate 60 as Vsub. By this, the charges accumulated in the floating gate 66 is flown into the semiconductor substrate 60 due to the FN tunneling effect, causing an erase state in which no charge is stored in the floating gate 66. The distribution of Vth at this point is shown as the erase state in FIG. 1B.

In writing data, the source 62 and the semiconductor substrate 60 are grounded. A positive voltage (an example is 9 V) is applied to the control gate 68 as Vg, and a positive voltage (an example is 5 V) is applied to the drain 64 as Vd. By this, hot electrons generated between the source 62 and the drain 64 are accumulated in the floating gate 66. At this point, the charge amount accumulated in the floating gate 66 can be varied by changing the time to apply the voltages. Then, as shown in FIG. 1B, the charge amount accumulated in the floating gate 66 is adjusted so that there are three Vths, namely, program state 1 program state 2, and program state 3. In this manner, the four values can be stored in a memory cell. In other words, two binary bits can be stored.

Japanese Patent Application Publication No. 08-213573 discloses a semiconductor device having a method of applying an erase voltage of the memory cell to the channel region in the NAND flash memory.

In the conventional flash memory, however, Vth of the transistor has to be strictly controlled in writing and reading data. Referring to FIG. 1B (Prior Art) again, unless adjacent distributions of Vths are completely separated from each other, a malfunction occurs. Yet, as the memory size becomes smaller, Vth is more sensitive to the charge amount accumulated. Therefore, it is not easy to control Vth.

SUMMARY OF THE INVENTION

The present invention has been made in view of the above circumstances and provides a control method that can perform Vth control of the transistor included in the memory cell.

According to a first aspect of the present invention, there is preferably provided a semiconductor device including: an insulation layer provided on a semiconductor substrate; a p-type semiconductor region provided on the insulation layer; an isolation region provided that surrounds the p-type semiconductor region to reach the insulation layer; an n-type source region and an n-type drain region provided on the p-type semiconductor region; a charge storage region provided above the p-type semiconductor region between the n-type source region and the n-type drain region; and an voltage applying portion that applies a different voltage to the p-type semiconductor region while any of programming, erasing and reading a different data of a memory cell that has the charge storage region is being preformed. It is possible to control Vth of the transistor that composes the memory cell.

According to a second aspect of the present invention, there is preferably provided a semiconductor device including: an insulation layer provided on a semiconductor substrate; a p-type semiconductor region provided on the insulation layer; an isolation region that surrounds the p-type semiconductor region to reach the insulation layer, and that includes an oxide silicon region and an n-type semiconductor region; an n-type drain region provided on the p-type semiconductor region; an n-type source region provided on the p-type semiconductor region and on the n-type semiconductor region; and a charge storage region provided above the p-type semiconductor region between the n-type source region and the n-type drain region. It is possible to control Vth of the transistor that composes the memory cell in a NOR flash memory in which multiple values can be stored in a memory cell.

According to a third aspect of the present invention, there is preferably provided a method of controlling a semiconductor device having an insulation layer provided on a semiconductor substrate; a p-type semiconductor region provided on the insulation layer; an isolation region provided that surrounds the p-type semiconductor region to reach the insulation layer; an n-type source region and an n-type drain region provided on the p-type semiconductor region; a charge storage region provided above the p-type semiconductor region between the n-type source region and the n-type drain region, the method of controlling the semiconductor device including the steps of: applying a first voltage to the p-type semiconductor region while any of programming, erasing, and reading of a memory cell having the charge storage region is being performed; and applying a second voltage, different from the first voltage, to the p-type semiconductor region while said any of programming, erasing, and reading of the memory cell is being performed. It is possible to control Vth of the transistor that composes the memory cell.

BRIEF DESCRIPTION OF THE DRAWINGS

FIG. 3A through FIG. 3D show the flash memory in accordance with a first embodiment of the present invention;

FIG. 8A through FIG. 8D show the flash memory in accordance with a second embodiment of the present invention;

DESCRIPTION OF THE PREFERRED EMBODIMENTS

A description will now be provided, with reference to the accompanying drawings, of embodiments of the present invention.

Figure 1A:
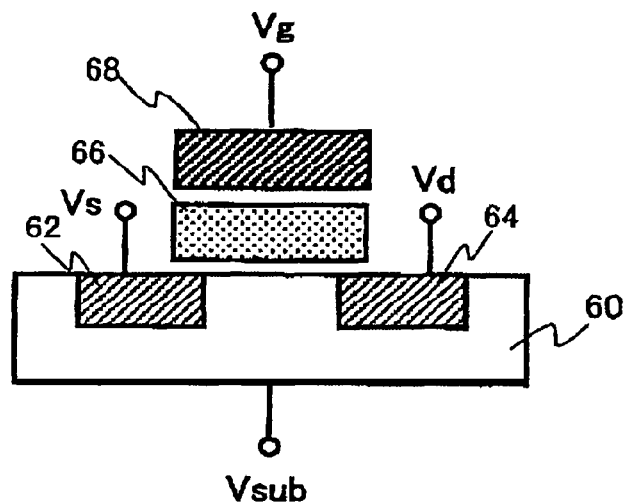
FIG. 1A (Prior Art) is a schematic cross-sectional view of the transistor included in the memory cell of the flash memory of the conventional technique.
Figure 1B:
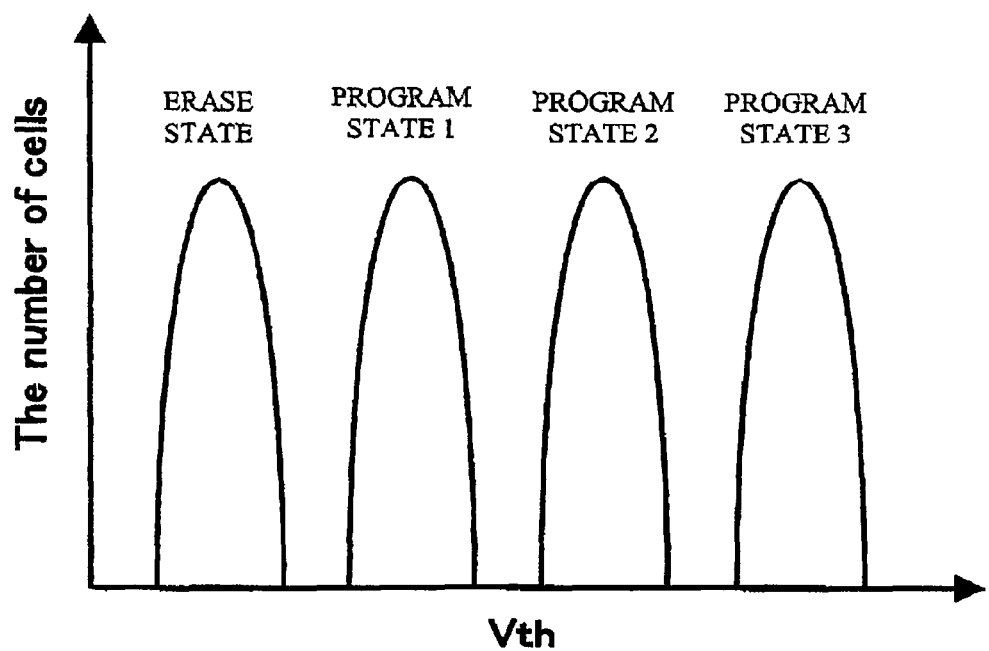
FIG. 1B (Prior Art) is a view illustrating the principle of the multi-level storage.
Figure 2A:
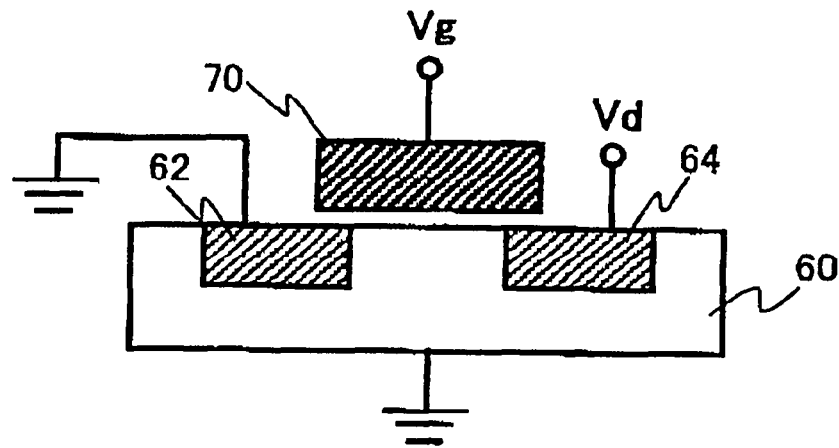
FIG. 2A through FIG. 2C are views illustrating the effects that are the principle of the present invention.
Figure 2B:
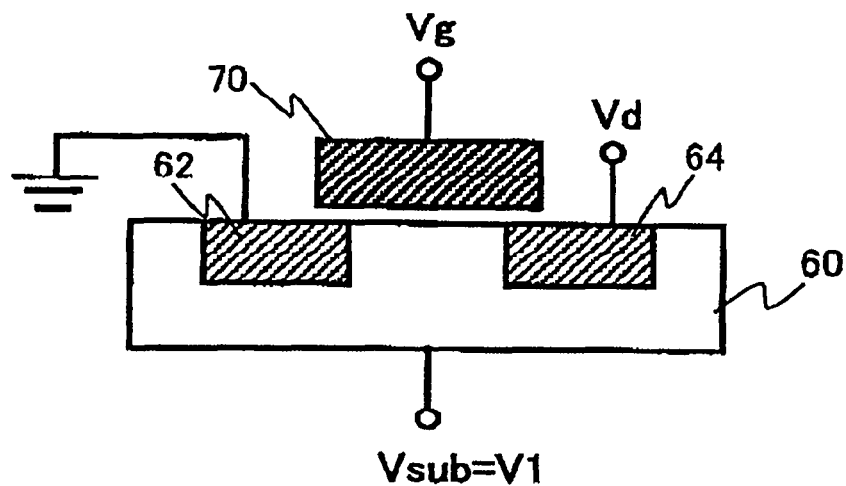
Figure 2C:
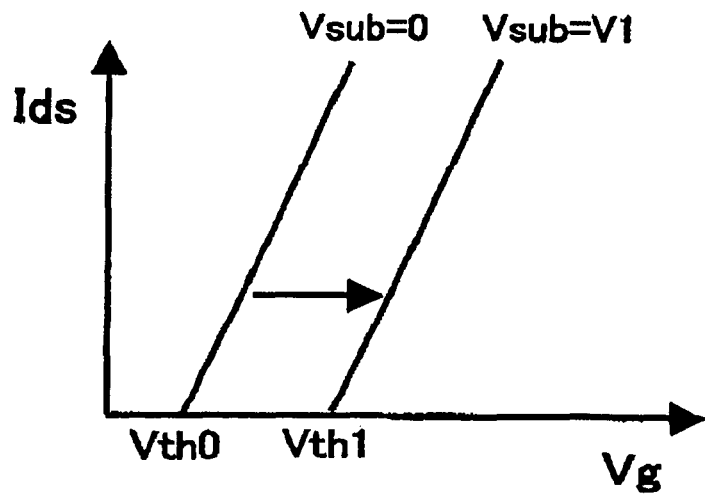

Firstly, referring to FIG. 2A through FIG. 2C, a description will be given of the effect, which illustrates an embodiment of the present invention. FIG. 2A and FIG. 2B are schematic cross-sectional views of a transistor. For easy explanation, the floating gate and the control gate are omitted, and are configured as a gate 70. A gate oxide film is provided between the gate 70 and the semiconductor substrate 60. The same components and configurations as those of FIG. 1A have the same reference numerals and a detailed explanation will be omitted. Vth of such configuration is expressed in Expression below. Here, $V_{fb}$ represents flat-band potential, $\phi_b$ represents surface potential, $\in_{si}$ represents dielectric constant of silicon, q represents quantum of electricity, $N_a$ represents acceptor density of a P-type semiconductor substrate, $C_{ox}$ represents capacitance of the gate oxide film, and Vsub represents potential of the semiconductor substrate 60.

$$V_{th} = V_{fb} + 2\phi_b + \frac{\sqrt{2\varepsilon_{si} q N_a (2\phi_b + V_{sub})}}{C_{ox}} \quad \text{(Expression 1)}$$

As shown above, Vth varies depending on Vsub. This is described with reference to FIG. 2A through FIG. 2C. Referring to FIG. 2A, the semiconductor substrate 60 is grounded. That is, Vsub=0. At this time, a source-drain current Ids with respect to a gate voltage Vg is shown as a line of Vsub=0 in FIG. 2C. Here, Vth is represented as Vth0. On the other hand, referring to FIG. 2B, Vsub=V1 is applied to the semiconductor substrate 60. At this time, Ids–Vg is shown as a line of Vsub=V1 in FIG. 2C. Here, Vth is represented as Vth1. In this manner, Vth of the transistor can be shifted by changing the potential of the semiconductor substrate 60. A description will now be given of embodiments of the present invention that utilizes such effect, with reference to the accompanying drawings.

First Embodiment

A first embodiment is an example of a NOR flash memory in which the floating gate serves as a charge storage layer. FIG. 3A through FIG. 3D show the flash memory in accordance with the first embodiment of the present invention. FIG. 3A is a top view of the flash memory (a second wiring layer 50, a second interlayer insulation film 46, a first interlayer insulation film 40, an ONO cover film 35, and a tunnel oxide film 34 are not shown). FIG. 3B is a cross-sectional view taken along a line A-A in FIG. 3A (cross-sectional view of a length direction of a P-type semiconductor substrate 16). FIG. 3C is a cross-sectional view taken along a line B-B in FIG. 3A (cross-sectional view of a length direction of word lines 32). FIG. 3D is a cross-sectional view taken along a line C-C in FIG. 3A (cross-sectional view of a length direction of sources 20). In FIG. 3B and FIG. 3C, the second wiring layer 50, the second interlayer insulation film 46, a first wiring layer 44, and the first interlayer insulation film 40 are not shown.

Referring to FIG. 3A through FIG. 3D, an insulation layer 14 made of a silicon oxide layer and the P-type semiconductor substrate 16 (P-type silicon semiconductor region) are provided on a silicon semiconductor substrate 12, forming an SOI structure. Referring to FIG. 3B, the P-type semiconductor region 16 is surrounded by a trench oxide film 18 that reaches the insulation layer 14. The sources 20 and drains 22 are formed on the P-type semiconductor region 16. Regions between the sources 20 and the drains 22 serve as channels. Floating gates 30 are arranged above the channel regions through tunnel oxide films 34. Above the floating gates 30, there are provided the word lines 32 that also serve as the control gates through the ONO cover films 35. The first interlayer insulation film 40 is formed to cover the word lines 32, and the first wiring layer 44, the second interlayer insulation layer 46, and the second wiring layer 50 are formed on the first interlayer insulation film 40. The first wiring layer 44 is coupled to the drain 22 via a contact hole 42. The first wiring layer 44 runs in a width direction of the word lines 32 to form bit lines, as indicated by dotted lines in FIG. 3A. The second wiring layer 50 is coupled to the P-type semiconductor region 16 via a contact hole 48. In each of the P-type semiconductor regions 16, a different contact hole 48 is provided to be connected by the second wiring layer 50 respectively.

Referring to FIG. 3C, the trench oxide film 18 isolates adjacent P-type semiconductor regions 16 that run in a length direction of the word lines 32. Referring to FIG. 3D, an N-type well region 24 that reaches the insulation layer 14 isolates adjacent P-type semiconductor regions 16 in a length direction of the sources 20. Accordingly, the P-type semiconductor regions 16 correspond to regions of P as indicated by dashed lines in the drawings, are surrounded by the trench oxide films 18 and the N-type well regions 24 at the sides thereof and surrounded by the insulation layer 14 at the bottom thereof, and are isolated by the trench oxide films 18 or PN junctions. Referring to FIG. 3C, the floating gates 30 are provided through the tunnel oxide films 34 above the P-type semiconductor substrate 16, and the word line 32 is provided through the ONO cover film 35 above the floating gate 30. The word lines 32 are successively provided in a horizontal direction of FIG. 3A. Referring to FIG. 3D, the sources 20 are continuously provided on and between the P-type semiconductor regions 16 to form source lines. In addition, referring to FIG. 3A, the sources 20 are coupled to an upper wiring by contact holes 41. A region of Cell forms one memory cell.

Figure 4A:
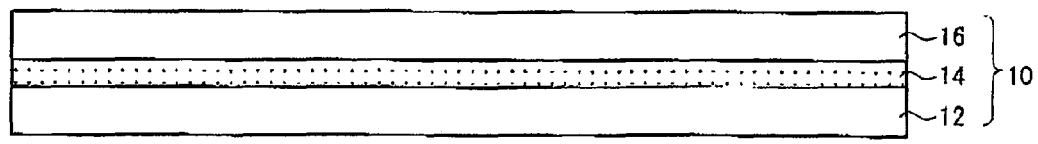
FIG. 4A through FIG. 4C are first cross-sectional views, taken along a line A-A in FIG. 3A, illustrating a fabrication method of the flash memory in accordance with the first embodiment of the present invention.
Figure 4B:
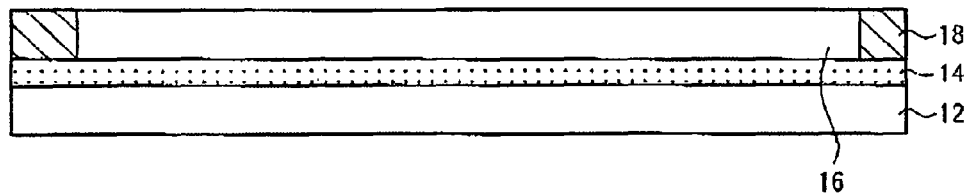

Next, a description will be given of a fabrication method of the flash memory in accordance with the first embodiment of the present invention. FIG. 4A through FIG. 4C and FIG. 5A through FIG. 5C are cross-sectional views, taken along a line A-A shown in FIG. 3A, illustrating the fabrication method of the flash memory in accordance with the first embodiment of the present invention. Referring to FIG. 4A, the SOI substrate 10 is formed by: the semiconductor substrate 12; the insulation layer 14 provided on the semiconductor substrate 12; and the semiconductor layer (P-type semiconductor region) 16 provided on the insulation layer 14. Referring to FIG. 4B, the trench oxide film 18 is formed in a given region of the semiconductor layer (P-type semiconductor region) 16, as described hereafter. A given region of the semiconductor layer 16 is removed to the insulation layer 14. The silicon oxide film is embedded by CVD or the like. The surface is planarized by CMP or the like. In this manner, the trench oxide film 18 is formed. Subsequently, the N-type well region 24 (not shown in FIG. 4B) that reaches the insulation layer 14 is formed by injecting arsenic ions, for example. The trench oxide films 18 are provided between regions in which the drains 22 of memory cells are adjacently formed in a length direction of the word lines 32. Meanwhile, the N-type well regions 24 are provided between the regions in which the sources 20 are formed.

Figure 4C:
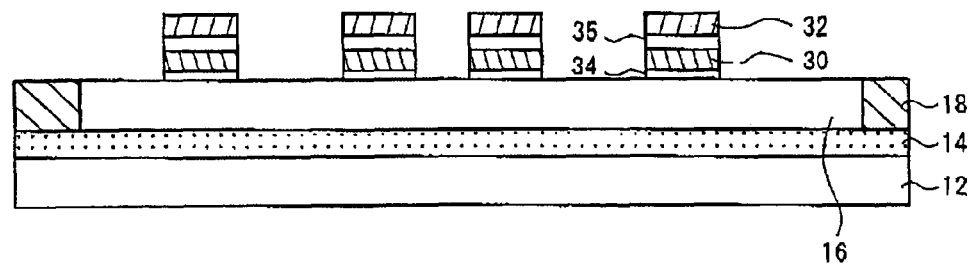

Referring to FIG. 4C, the floating gates 30 and the word lines 32 are formed in the following. A silicon oxide film is provided on the P-type semiconductor region 16 by a thermal oxidation method or CVD, as the tunnel oxide film 34. A polysilicon film is deposited on the tunnel oxide film 34. A given region of the polysilicon film is removed to form the floating gates 30. The ONO cover films 35 (silicon oxide film/silicon nitride film/silicon oxide film) are deposited on the floating gates 30. A polysilicon film is deposited in the ONO cover film 35. A given region of the polysilicon film is removed to form the word lines 32. A silicon oxide film (not shown) is provided to cover the word lines 32. As stated heretofore, the floating gates 30 and the word line 32 surrounded by the insulation films are fabricated.

Figure 5A:
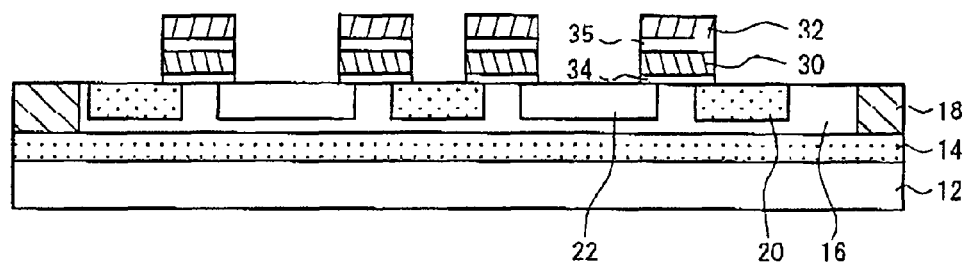
FIG. 5A through FIG. 5C are second cross-sectional views, taken along a line A-A in FIG. 3A, illustrating the fabrication method of the flash memory in accordance with the first embodiment of the present invention.

Referring to FIG. 5A, for example, arsenic (As) ions are injected by using the word lines 32 as a mask, and the sources 20 and the drains 22 are formed. At this time, the trench oxide films 18 are provided in element isolation regions between the drains 22 of the memory cells adjacently provided in a length direction of the word lines 32. Therefore, arsenic ions that are injected are not active. Meanwhile, the N-type well region 24 is provided in the element isolation regions between the sources 20, and the trench oxide film 18 is not provided. For this reason, the sources 20 are successively provided in a length direction of the word lines 32.

Figure 5B:
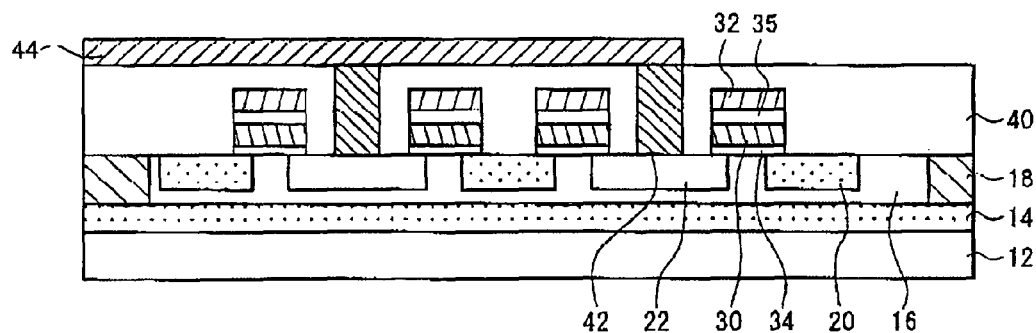

Referring to FIG. 5B, a silicon oxide film is deposited, for example, by TEOS process as the first interlayer insulation film 40 so as to cover the word lines 32. In the first interlayer insulation film 40, contact holes 42 coupled to the drains 22 are formed. In the contact holes 42, a plug metal such as tungsten (W) or the like is embedded. The first wiring layer 44 that mainly includes aluminum (Al) is formed on the first interlayer insulation film 40.

Figure 5C:
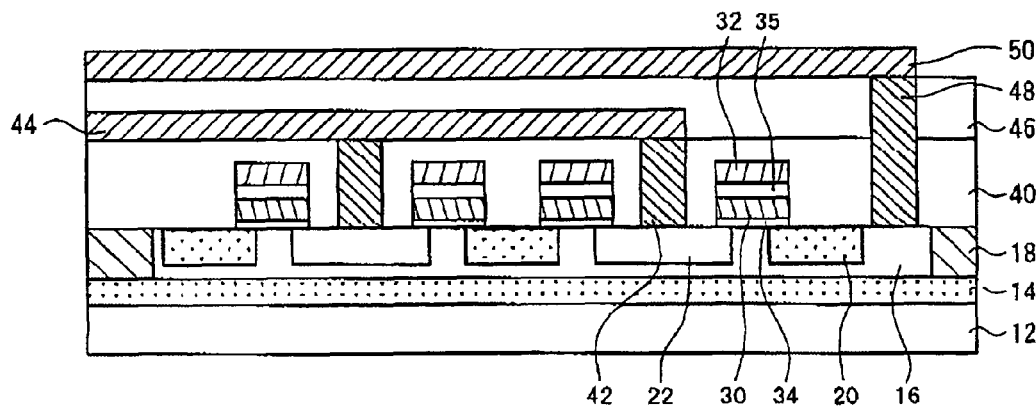

Referring to FIG. 5C, a silicon oxide film is deposited by TEOS process as the second interlayer insulation film 46 on and above the first interlayer insulation film 40 so as to cover the first wiring layer 44. The contact hole 48 is formed in the second interlayer insulation film 46 and in the first interlayer insulation film 40 so as to be coupled to the P-type semiconductor region 16. In the contact hole 48, a plug metal such as tungsten (W) or the like is embedded. The second wiring layer 50 that mainly includes aluminum (Al) is formed on the second interlayer insulation film 46. A protection film is provided on and above the second interlayer insulation film 46 to cover the second wiring layer 50. In this manner, the flash memory employed in the first embodiment is completed.

Figure 6:
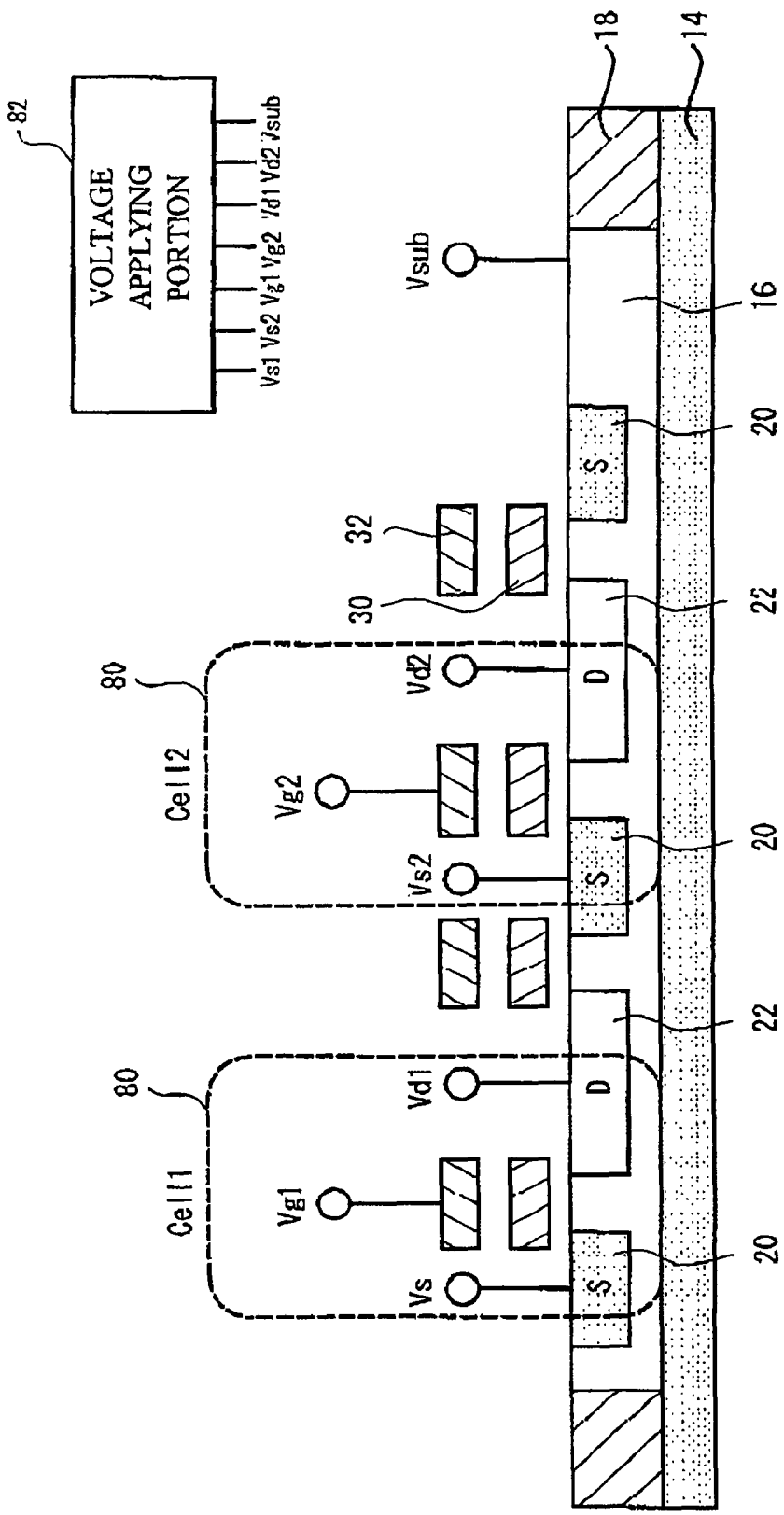
FIG. 6 is a schematic cross-sectional view, taken along a line A-A shown in FIG. 3A, illustrating a transistor that composes a memory cell in accordance with the first embodiment of the present invention.
Figure 7A:
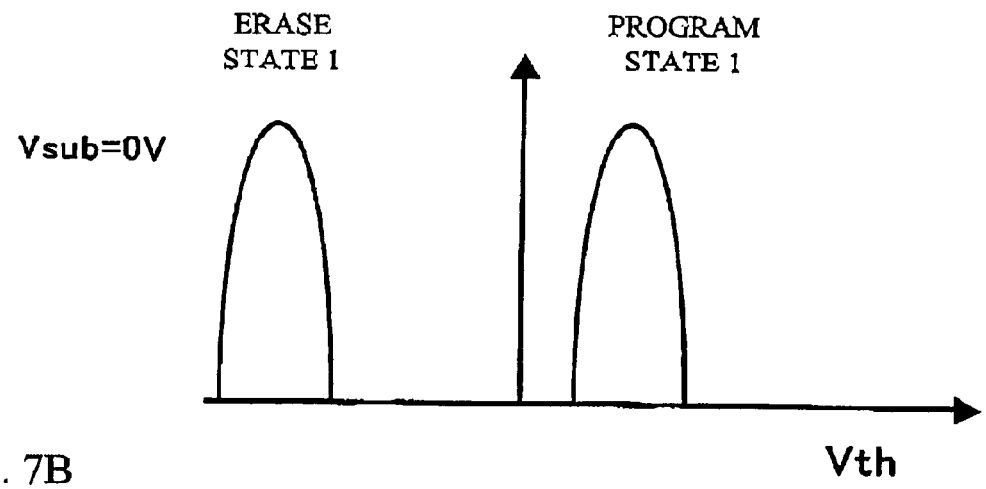
FIG. 7A, FIG. 7B, and FIG. 7C are views illustrating a control method of the flash memory in accordance with the first embodiment, where the horizontal axis represents Vth and the vertical axis represents the number of the memory cells for each Vth.
Figure 7B:
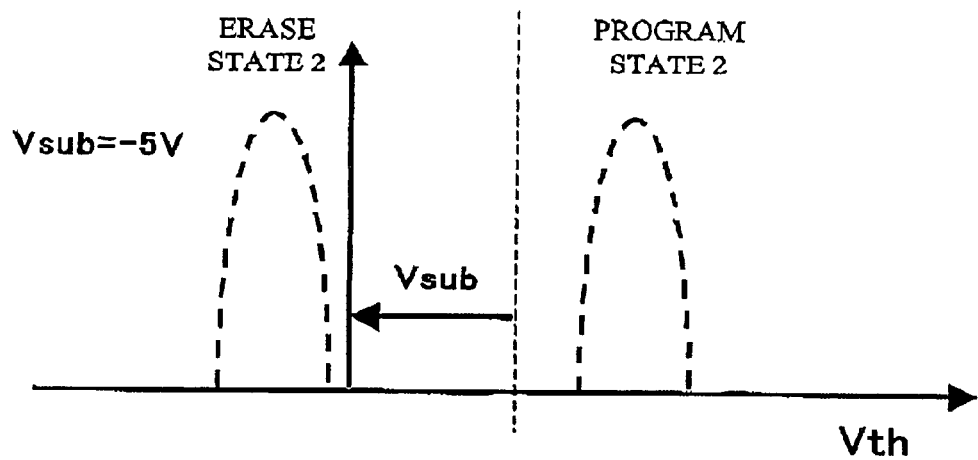
Figure 7C:
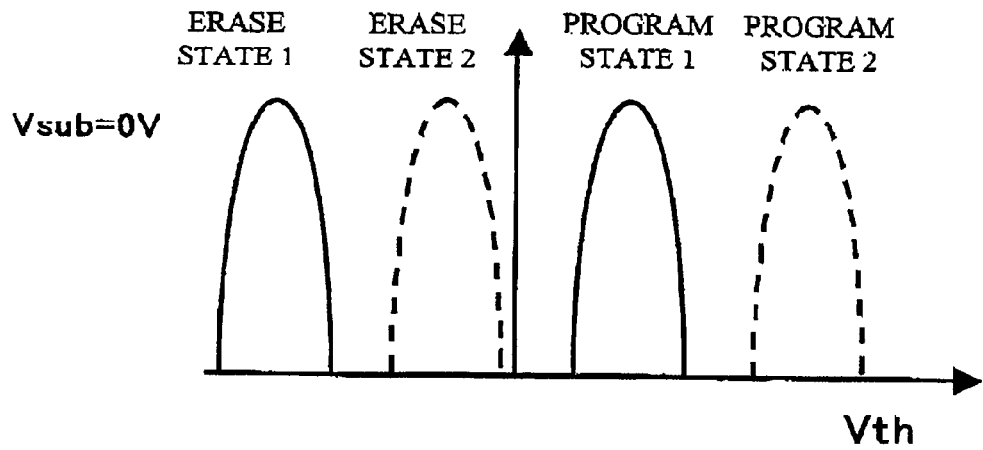

Next, referring to FIG. 6, FIG. 7A through FIG. 7C, and Table 1 a description will be given of a control method of the flash memory in accordance with the first embodiment. Table 1 shows examples of voltages of the control gate (word line), drain, source, and substrate (P-type semiconductor region) at the time of erasing, programming, and reading data. FIG. 6 is a cross-sectional view, taken along a line A-A shown in FIG. 3A, illustrating the transistor that composes the memory cell. The P-type semiconductor region 16 is connected to Vsub. The source 20, the drain 22, and the control gate (word line) 32 that compose a memory cell 1 are respectively connected to Vs1, Vd1, and Vg1. In a similar manner, the source 20, the drain 22, and the control gate (word line) 32 of the transistor that compose a memory cell 2 are respectively connected to Vs2, Vd2, and Vg2. A voltage applying portion 82 outputs Vs1, Vs2, Vd1, Vd2, Vg1, Vg2, and Vsub. In FIG. 7A through FIG. 7C, the horizontal axis represents Vth, and the vertical axis represents the number of the memory cells for each Vth.

TABLE 1

|  | ERASE STATE | | PROGRAM STATE | | Unit: V |
| --- | --- | --- | --- | --- | --- |
|  | STATE 1 | STATE 2 | STATE 1 | STATE 2 | READ |
| Control Gate | −9 | −9 | 9 | 9 | 5 |
| Drain | open | open | 5 | 5 | 1.5 |
| Source | open | open | 0 | 0 | 0 |
| Substrate | 9 | 4 | 0 | −5 | 0 |

Referring to FIG. 7A, to erase the data from the memory cell 1 for example, the source Vs1 and the drain Vd1 are opened and −9 V is applied to the control gate Vg1 and 9 V is applied to the P-type semiconductor region Vsub. This erases the charges from the floating gate 30, and the Vth distribution of the erase state 1 is obtainable as indicated by a solid line in the drawing. To program the memory cell 1 the source Vs1 and the P-type semiconductor region Vsub are grounded, and 5 V is applied to the drain Vd1 and 9 V is applied to the control gate Vg1. This writes the charge in the floating gate 30, and the Vth distribution of the program state 1 is obtainable as indicated by a solid line in the drawing.

Next, referring to FIG. 7B, −5 V is applied to the P-type semiconductor region as Vsub to erase and program in a similar manner. As described in FIG. 1C, Vth is shifted by applying Vsub to the P-type semiconductor region 16. To erase the data of the memory cell 1 for example, the source Vs1 and the drain Vd1 are opened and −9 V is applied to the control gate Vg1 and 4 V is applied to the P-type semiconductor region Vsub. This erases the charges from the floating gate 30, and the Vth distribution of the erase state 2 is obtainable as indicated by a dashed line in the drawing. To program the memory cell 1 the source Vs1 is grounded, −5 V is applied to the P-type semiconductor region Vsub, 5 V is applied to the drain Vd1, and 9 V is applied to the control gate Vg1. This writes the charge in the floating gate 30, and the Vth distribution of the program state 2 is obtainable as indicated by a dashed line in the drawing. In the state where −5 V is applied to the P-type semiconductor region as Vsub, the Vth distribution of the erase state 2 and that of the program state 2 seem same as those of the erase state 1 and the program state 1 shown in FIG. 7A.

Referring to FIG. 7C, when Vsub of the P-type semiconductor region 16 is set back to 0V, Vth distribution of the erase state 2 and that of the program state 2 are shifted not to overlap the Vth distribution of the erase state 1 and that of the program state 1. In this state, the source Vs1 is grounded, and 5 V is applied to the control gate Vg1 and 1.5 V is applied to the drain Vd1. The charge state is read from the floating gate 30, by detecting the current flowing between the source 20 and the drain 22. This enables the data of the memory cell to be read. In this manner, binary bits of four values can be stored in and read from one memory cell.

The flash memory used in the first embodiment includes: the insulation layer provided on the semiconductor substrate 12; the P-type semiconductor region 16 provided on the insulation layer 14; the trench oxide film 18 and N-type well region 24 (element isolation region) that surround the P-type semiconductor region 16 and reach to the insulation layer 14; the sources 20 (N-type source region) and drains 22 (N-type drain region) provided on the P-type semiconductor region 16; the floating gate 30 (charge storage region) provided between the source 20 and the drain 22 above the P-type semiconductor region; the control gate 32 provided above the floating gate; and the contact hole 48 and the second wiring layer 50 that apply a voltage to the P-type semiconductor region 16.

Accordingly, it is possible to apply a voltage to the P-type semiconductor region 16 that includes only the memory cell surrounded by the element isolation regions separately from other memory cells. This makes it possible to selectively make the memory cell, in which the voltage is applied to the P-type semiconductor region 16, in the erase state 2 or in the program state 2. Therefore, in the multi-level flash memory, Vth of a transistor that composes a memory cell can be controlled with ease.

In addition, the source 20 (N-type source region) is provided on the N-type well region 24 (N-type semiconductor region). By this, the sources 20 provided on the adjacent P-type semiconductor regions 16 can be fabricated in a continuous manner. It is therefore possible to control Vth of the transistor that composes a memory cell with ease, when multi-level data is stored in the NOR flash memory.

Furthermore, it is possible to program the charge states of four values or more in the floating gate 30. Different voltages (9 V, 0 V, 4 V, and −5 V) are applied to the P-type semiconductor region 16 when different charge states (erase state 1 erase state 2, program state 1 and program state 2) are set. It is therefore possible to control Vth of the transistor that composes a memory cell with ease in the flash memory that stores multiple values.

Furthermore, the P-type semiconductor regions 16 are isolated by the trench oxide film 18 (silicon oxide film) and the N-type well region 24 (N-type semiconductor region). The surrounding of the P-type semiconductor region 16 can be isolated with certainty by isolating the regions where the sources 20 are to be formed between the P-type semiconductor regions 16 by using the N-type well regions 24.

Furthermore, the floating gate 30 is included as the charge storage region. This makes it possible to control Vth of the transistor that composes a memory cell with ease in a flash memory that has the floating gates.

Also, the control method of the flash memory used in the first embodiment includes: applying a first voltage (0 V) to the P-type semiconductor region 16 to write the charge into the floating gate 30 (charge storage region); and applying a second voltage (−5 V) lower than the first voltage to the P-type semiconductor region 16 to write the charge into the floating gate 30. This makes it possible to obtain two program states of different Vth distributions.

Furthermore, the control method of the flash memory used in the first embodiment further includes: applying a third voltage (9 V) to the P-type semiconductor region 16 to erase the charges from the floating gate 30; and applying a fourth voltage (4 V) lower than the third voltage to the P-type semiconductor region 16 to erase the charges from the floating gate 30. This makes it possible to obtain two erase states of different Vth distributions.

Furthermore, the difference (−9 V) between the first voltage (0 V) and the third voltage (9 V) is substantially same as the difference (−9 V) between the second voltage (−5 V) and the fourth voltage (4 V). This can provide the Vth distribution spacing of the erase state 2 substantially same as that of the program state 2, and the Vth distribution spacing of the erase state 1 and that of the program state 1.

Furthermore, the fourth voltage (4 V) may be between the first voltage (0 V) and the third voltage (9 V). This can provide the Vth distribution of the erase state 2 between the erase state 1 and the program state 1.

Furthermore, there may be also provided a step of reading the charge state of the floating gate 30 by applying a fifth voltage (0 V) to the P-type semiconductor region. This enables binary bits of four values to be stored in one memory cell.

Furthermore, the fifth voltage (0 V) may be substantially identical to the first voltage (0 V). This can reduce the number of the voltages to be applied. Here, substantially identical means that it is identical in the range of accuracy of the voltages to be applied from the voltage applying portion 82.

Second Embodiment

A second embodiment is an example of a SONOS flash memory. FIG. 8A through FIG. 8D are views illustrating a flash memory in accordance with the second embodiment of the present invention. FIG. 8A is a top view of the flash memory (the second wiring layer 50, the second interlayer insulation film 46, the first interlayer insulation film 40, and the ONO film 36 are not shown). FIG. 8B is a cross-sectional view of the flash memory taken along a line A-A shown in FIG. 8A (cross-section in a length direction of the P-type semiconductor region 16). FIG. 8C is a cross-sectional view of the flash memory taken along a line B-B shown in FIG. 8A (cross-section in a length direction of the word lines 32). FIG. 8D is a cross-sectional view of the flash memory taken along a line C-C shown in FIG. 8A (cross-section in a length direction of the sources 20). In FIG. 8B and FIG. 8C, the second wiring layer 50, the second interlayer insulation film 46, the first wiring layer 44, and the first interlayer insulation film 40 are not shown.

In the second embodiment, the configuration of the floating gate 30, the word line 32, and the tunnel oxide film 34 employed in the first embodiment is replaced with the ONO film 36 and the word line 32. The other components and configurations are same as those of the first embodiment, and a detailed explanation will be omitted. Referring to FIG. 8A and FIG. 8B, on the P-type semiconductor region 16, there is formed an ONO (Oxide/Nitride/Oxide) film 36 including: a silicon oxide film formed by thermal oxidation; a trap layer (silicon nitride film) formed by CVD; and a top oxide film (silicon oxide film) formed by CVD. The word lines 32 also serving as the control gates are provided on the ONO film between the sources 20 and the drains 22. Referring to FIG. 8C, below the word line 32, there is formed the ONO film 36 on the trench oxide films 18 between the P-type semiconductor regions 16. Referring to FIG. 8D, the ONO film 36 is formed on the source 20.

As stated, also in the flash memory that includes a trap layer in the ONO film 36, instead of the floating gate, as a charge storage region, the present invention can be applied by utilizing the same control method as described in the first embodiment. Accordingly, the same effect is obtainable.

Third Embodiment

Figure 9C:
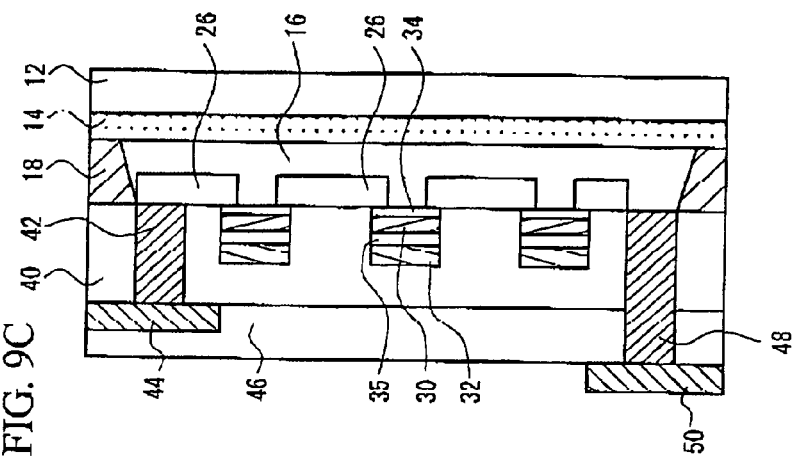
FIG. 9A through FIG. 9C show the flash memory in accordance with a third embodiment of the present invention.
Figure 9A:
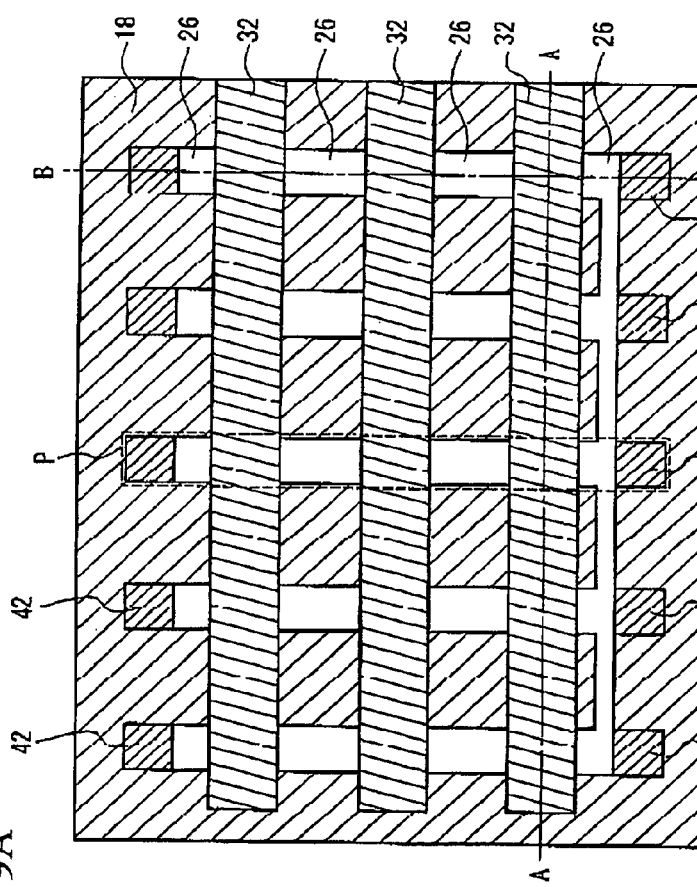
Figure 9B:
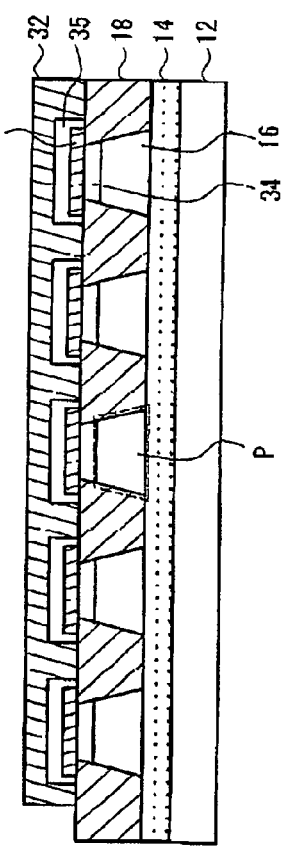

A third embodiment is an example of a NAND flash memory in which the control gate is used as the charge storage layer. FIG. 9A through FIG. 9C are views illustrating a flash memory in accordance with the third embodiment of the present invention. FIG. 9A is a top view of the flash memory (the second wiring layer 50, the second interlayer insulation film 46, the first interlayer insulation film 40, the ONO cover film 35, and the tunnel oxide film 34 are not shown). FIG. 9B is a cross-sectional view of the flash memory taken along a line A-A shown in FIG. 9A (cross-section in a length direction of the word lines 32). FIG. 9C is a cross-sectional view of the flash memory taken along a line B-B shown in FIG. 9A (cross-section in a length direction of the P-type semiconductor region 16). In FIG. 9B, the second wiring layer 50, the second interlayer insulation film 46, the first wiring layer 44, and the first interlayer insulation film 40 are not shown.

Referring to FIG. 9A through FIG. 9D, there are provided the insulation layer 14 made of a silicon oxide layer and the P-type semiconductor region 16 (P-type silicon semiconductor region) to form an SOI structure. Referring to FIG. 9C, the P-type semiconductor region 16 is surrounded by the trench oxide film 18 that reaches the insulation layer 14. Bit lines 26 are formed on the P-type semiconductor region 16. The bit lines 26 are regions that become channels. Floating gates 30 are provided above the regions that become channels through the tunnel oxide film 34. Above the floating gates 30, the word lines 32 also serving as the control gates are provided through the ONO cover films 35. The first interlayer insulation film 40 is formed to cover the word lines 32, and the first wiring layer 44, the second interlayer insulation film 46, and the second wiring layer 50 are formed thereon. The first wiring layer 44 is coupled to the bit line 26 via the contact hole 42. The second wiring layer 50 is coupled to the P-type semiconductor region 16 via the contact hole 48.

Referring to FIG. 9B, the trench oxide film 18 isolates the P-type semiconductor regions 16 adjacently provided in a length direction of the word lines 32. As stated, the P-type semiconductor regions 16 correspond to regions of P as indicated by dashed lines in the drawings, are surrounded by the trench oxide film 18 at the sides thereof and by the insulation layer 14 at the bottom thereof, and are isolated by the trench oxide films 18. In each of the P-type semiconductor regions 16, each contact hole 48 is formed to be coupled by the second wiring layer 50. Referring to FIG. 9B, the floating gates 30 are provided above the P-type semiconductor region 16 through the tunnel oxide films 34. The word lines 32 are provided above the floating gates 30 through the ONO cover films 35. The word lines 32 are successively provided.

In the third embodiment, there are provided: the contact hole 48 connected to the P-type semiconductor region 16 surrounded by the trench oxide film 18 and the insulation layer 14; and the second wiring layer 50. Then, erasing or programming is performed by changing the voltage applied to the P-type semiconductor region 16. This makes it possible to obtain the same effect as described in the first embodiment, also in the NAND flash memory.

Figure 10:
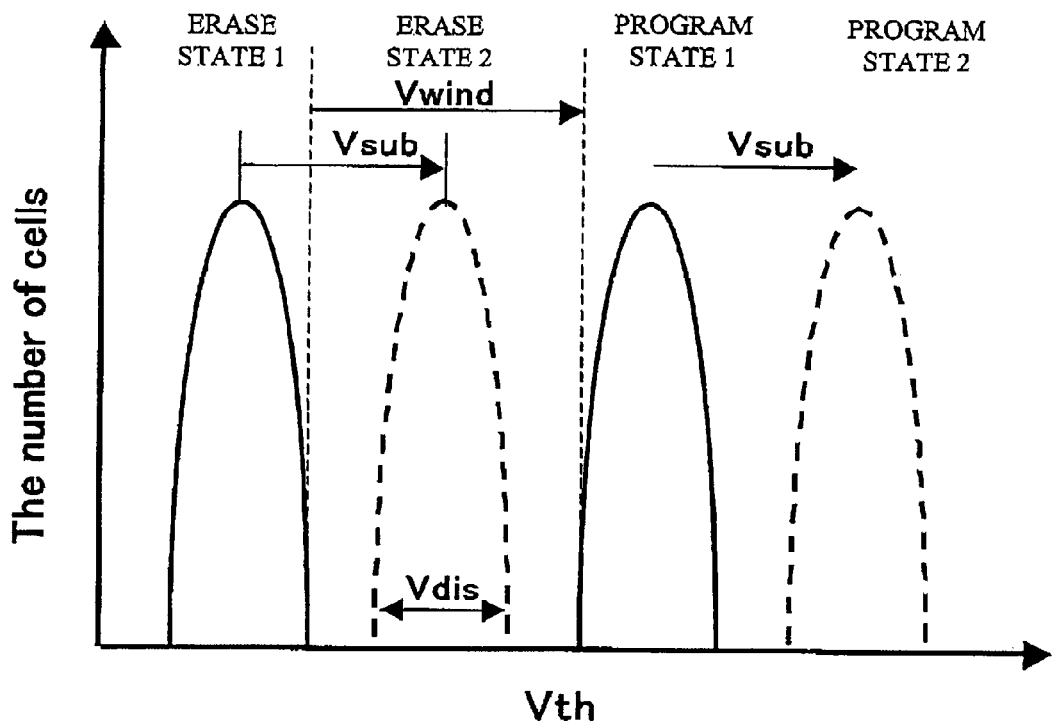
FIG. 10 shows the number of memory cells having each Vth with respect to Vth in the flash memory employed in the first through third embodiments of the present invention.

FIG. 10 shows the number of memory cells having each Vth with respect to Vth in the flash memory employed in the first through third embodiments. Referring to FIG. 10, it is assumed that Vwind is set to a difference between Vth of an upper limit in the erase state 1 and Vth of a lower limit in the program state 1. Vdis is set to the width of the Vth distribution in the erase state 2. At this time, if Vdis is smaller than Vwind, the erase state 2 can be provided between Vth of the upper limit in the erase state 1 and Vth of the lower limit in the program state 1 by applying the voltage Vsub of the P-type semiconductor region 16 for erasing. Accordingly, four values can be stored.

In addition, if Vdis is smaller than Vwind, multiple erase states can be provided between Vth of the upper limit in the erase state 1 and Vth of the lower limit in the program state 1 thereby allowing the flash memory to store four or more values of data.

In the first through third embodiments, preferably, the SOI substrate to be used is partially depleted. Being partially depleted can change the potential in the P-type semiconductor region 16. A description has been given of a case where three or four memory cells are included in the P-type semiconductor region 16. For example, it is possible to include the number of the memory cells that connect the bit lines. Also, it can be configured that the P-type semiconductor region 16 includes one memory cell. As this number is small, programming and erasing can be performed more separately. However, this needs more contact holes 48 and the second wiring layers 50 that connect the P-type semiconductor regions 16, thereby enlarging the area of the memory cell region. It is desirable to determine the number of the memory cells included in the P-type semiconductor region 16 in consideration of the above-described circumstances.

Fourth Embodiment

Figure 11:
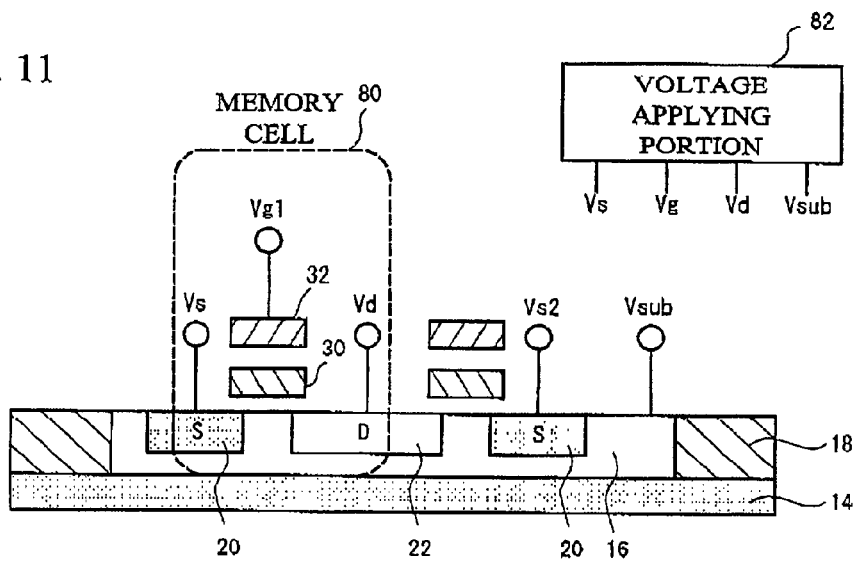
FIG. 11 is a schematic cross-sectional view showing a memory cell of a flash memory in accordance with a fourth embodiment of the present invention.
Figure 12:
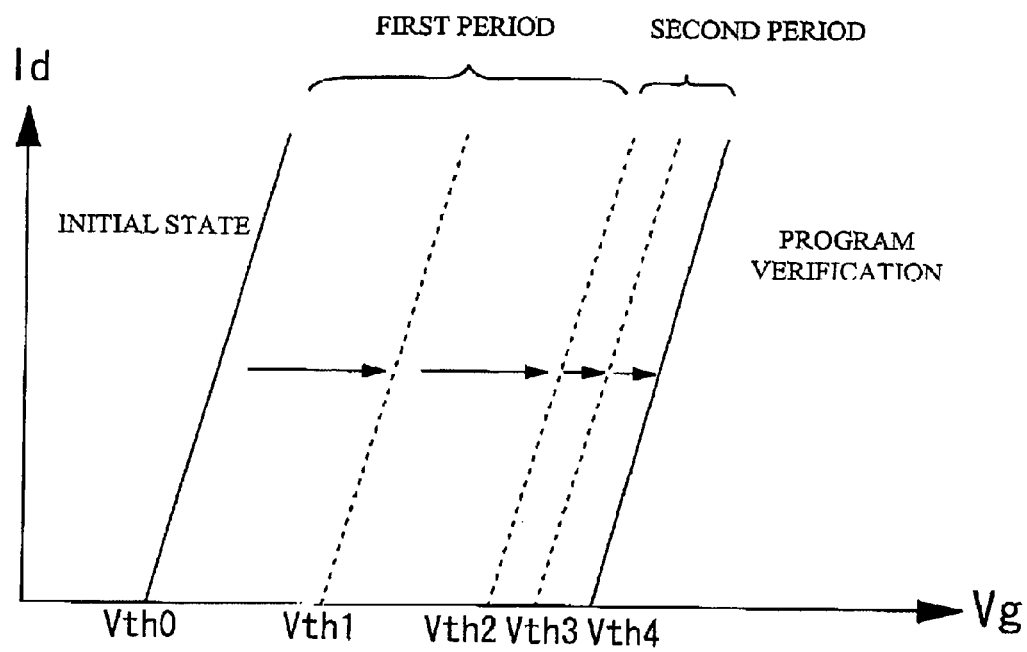
FIG. 12 is a view illustrating an operation of the flash memory in accordance with the fourth embodiment of the present invention.

A fourth embodiment is an example of a control method in programming data into the memory cell. FIG. 11 is a schematic cross-sectional view showing a memory cell 80 in which data is programmed. The same components and configurations as those of the first embodiment have the same reference numerals and a detailed explanation will be omitted. Voltages Vs, Vd, Vg, and Vsub are respectively applied to the source 20, the drain 22, the control gate (word line) 32, and the P-type semiconductor region 16 of the memory cell, from the voltage applying portion 82. FIG. 12 shows drain current–gate voltage (Id–Vg) characteristics of the memory cell 80. The charge is accumulated in the floating gate 30 (charge storage region) by applying pulses of the voltage shown in Table 2, from an initial state. This changes Vth to be positive from Vth0 to Vth1, . . . , Vth4 as indicated by arrows. When Vth exceeds a verification reference Vth4, programming is completed. Referring to Table 2, the voltage applying portion 82 applies −5 V to the P-type semiconductor region 16 as Vsub (first voltage) in the initial first period out of the periods while the charge is being written into the floating gate 30. In the second period getting closer to the verification reference Vth4, subsequent to the first period, out of the periods while the charge is being written into the floating gate 30, 0 V is applied to the P-type semiconductor region 16 as Vsub (second voltage).

|  | WRITE | Unit: V |
|---|---|---|
|  | ℑFIRST | SECOND ℑPERIOD |
| Control Gate | 9 | 9 |
| Drain | 5 | 5 |
| Source | 0 | 0 |
| Substrate | −5 | 0 |

In order to reduce the Vth distribution in the program state, preferably, the Vth change amount that changes by one pulse is made small. However, when the Vth change amount that changes by one pulse is made smaller, more pulses have to be applied to obtain a desired Vth and it takes time. According to the fourth embodiment, the voltage applying portion 82 sets Vsub (second voltage) in the second period higher than Vsub (first voltage) in the first period. This can change the Vth change amount that changes by one pulse, while keeping same voltages and pulse times applied to the source 20, the drain 22, and the control gate (word line) 32 of the transistor that composes the memory cell 80, in the first and second periods. This enables shortened program time and narrowed Vth distribution (that is, it is easy to control Vth). Also, in the first and second periods, the voltages and the pulse times to be applied to the memory cell are same, thereby enabling simplified control.

Fifth Embodiment

Figure 13:
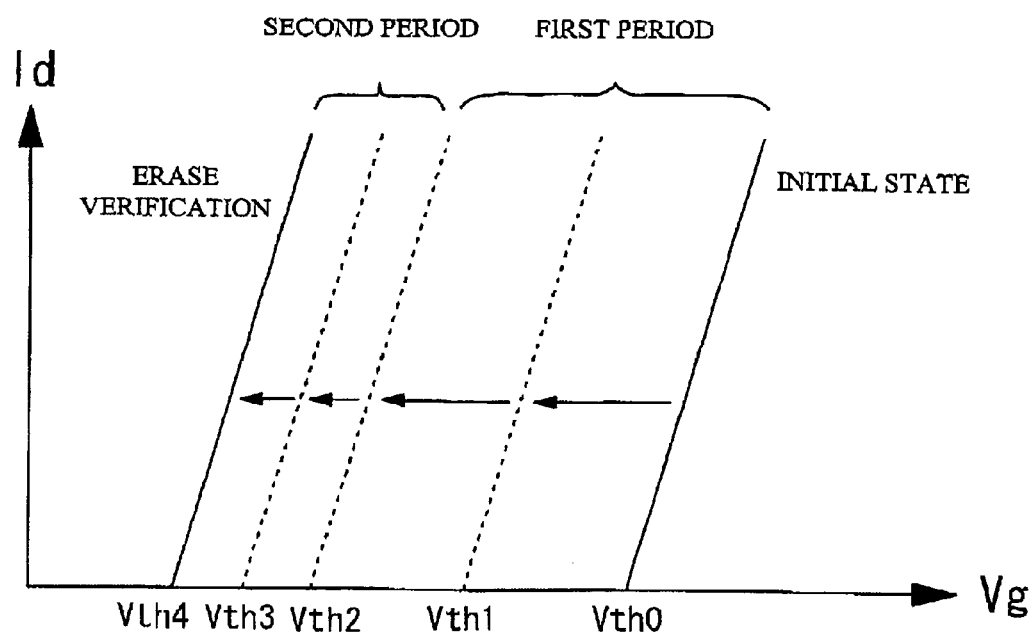
FIG. 13 is a view illustrating an operation of the flash memory in accordance with a fifth embodiment of the present invention.

A fifth embodiment is an example of a control method in erasing data from the memory cell. The components and configuration of the memory cell are same as those shown in FIG. 11, and a detailed explanation will be omitted. FIG. 13 shows the drain current–gate voltage (Id–Vg) characteristics of the memory cell 80. The charges are erased from the floating gate 30, by applying the pulses of the voltages shown in Table 3 from the initial state. This changes Vth to be negative from Vth0 to Vth1, . . . , Vth4 as indicated by arrows. When Vth exceeds the verification reference Vth4, erasing is completed. Referring to Table 3, the voltage applying portion 82 applies 9 V to the P-type semiconductor region 16 as Vsub (first voltage) in the initial first period out of the periods while the charge is being written into the floating gate 30. In the second period subsequent to the first period out of the periods while the charge is being written into the floating gate 30, 4 V is applied to the P-type semiconductor region 16 as Vsub (second voltage).

|  | WRITE | Unit: V |
|---|---|---|
|  | FIRST | SECOND PERIOD |
| Control Gate | −9 | −9 |
| Drain | open | open |
| Source | open | open |
| Substrate | 9 | 4 |

As stated, Vsub (second voltage) in the second period is made lower than Vsub (first voltage) in the first period. This can change the Vth change amount that changes by one pulse, while keeping same voltages and pulse times applied to the source 20, the drain 22, and the control gate (word line) 32 of the transistor that composes the memory cell 80 in the first and second periods. Also, in the first and second periods, the voltages and the pulse times to be applied to the memory cell are same, thereby enabling simplified control.

When multiple bits are stored in one memory cell, it is demanded that the width Vdis of the Vth distribution is made smaller, as described with reference to FIG. 10. Therefore, it is particularly effective to apply the fourth and fifth embodiments to a non-volatile memory having multi-level memory cells. The change from the first period to the second period in accordance with the fourth and fifth embodiments can be performed when Vth (or current value) of the memory cell exceeds a given value. Alternatively, after a given number of the pulses are applied in the first period, the first period can be changed to the second period. In this manner, the change timing from the first period to the second period can be determined as needed.

Sixth Embodiment

Figure 14:
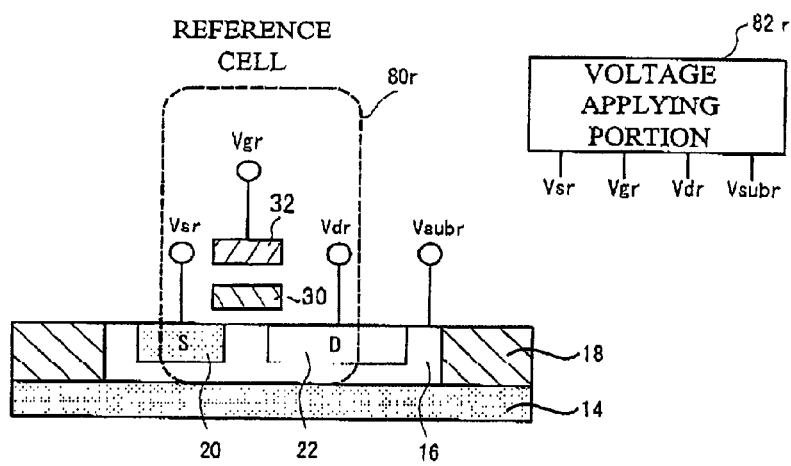
FIG. 14 is a schematic cross-sectional view of a transistor that composes a memory cell in the flash memory in accordance with a sixth embodiment of the present invention.
Figure 15:
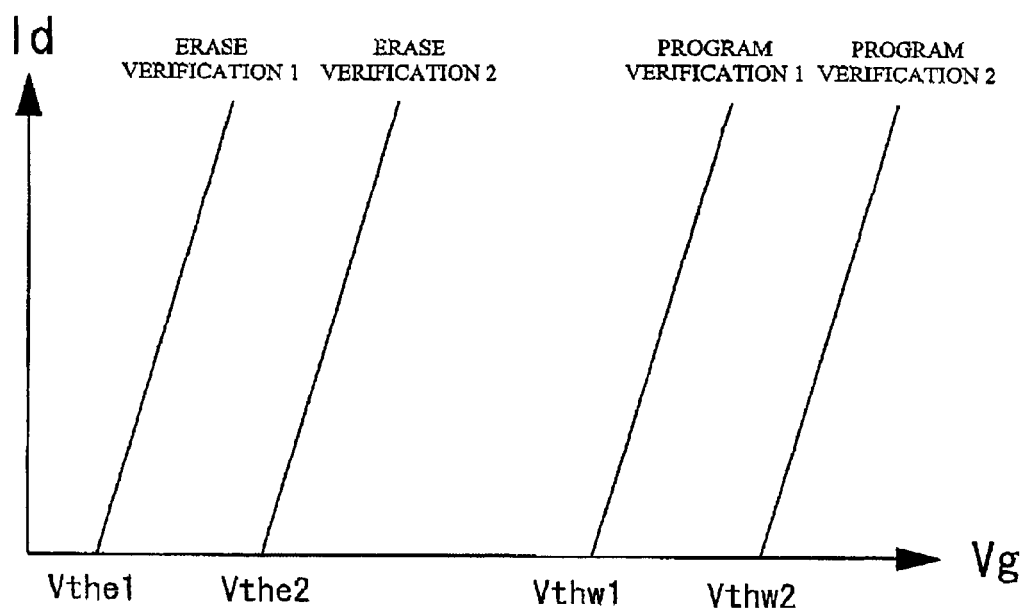
FIG. 15 is a view illustrating an operation of the flash memory in accordance with the sixth embodiment of the present invention.

A sixth embodiment is an example in which the structure employed in the first embodiment is applied to a reference cell. FIG. 14 is a cross-sectional view illustrating a reference cell 80r. The components and configuration same as those employed in the fourth embodiment have same reference numerals, and a detailed explanation will be omitted. Voltages Vsr, Vdr, Vgr, and Vsubr are respectively applied to the source 20, the drain 22, the control gate (word line) 32, and the P-type semiconductor region 16 of the reference cell 80r. FIG. 15 shows Id–Vg characteristics that serve as the verification references at the time of programming and erasing the memory cell.

Firstly, the reference cell 80r for programming and erasing is set with Vsubr=0. Referring to FIG. 14, when data is read out of the reference cell 80r, a voltage applying portion 82r applies different voltages Vsubr to the P-type semiconductor region 16. This can change the Id–Vg characteristics as shown in FIG. 15. In the sixth embodiment, when data is read out of the reference cell 80r for erasing, the voltage applying portion 82r applies −5 V to Vsubr as the state 1 in Table 4. This changes the verification reference Id–Vg at the time of erasing data to an erase verification 1 shown in FIG. 15, and changes Vth to Vthe1. Next, the voltage applying portion 82r applies 0 V to Vsubr as the state 2 shown in Table 4. This changes the verification reference Id–Vg to an erase verification 2, and changes Vth to Vthe2. In this manner, voltages Vsubr are different, when data is read out of the reference cell 80r. This can differ the Id–Vg characteristic that serves as a verification reference for erasing as shown by the erase verifications 1 and 2 of FIG. 15, even if the same voltages are applied to the source, gate, drain, substrate (or P-type semiconductor region) of the memory cell from which data is erased. Accordingly, with one reference cell 80r, two verification references can be output.

|  | READ | Unit: V |
|---|---|---|
|  | STATE 1 | STATE 2 |
| Control Gate | 5 | 5 |
| Drain | 1.5 | 1.5 |
| Source | 0 | 0 |
| Substrate | −5 | 0 |

Similarly, with one reference cell 80r, two verification references Vthw1 and Vthw2 can be output for program verification. In addition, with one reference cell 80r, four verification references can be provided by providing four stages of Vsub to be applied to the P-type semiconductor region 16. In this manner, with the use of one reference cell 80r, multiple verification references can be provided. Accordingly, for example, in a flash memory in which multiple values are stored in one memory cell, the number of the reference cells 80r can be reduced.

The fourth through sixth embodiment are examples of the flash memory having the NOR floating gate employed in the first embodiment. However, in the flash memory having the configuration described in the second and third embodiments, the same control employed in the fourth through sixth embodiments can be performed.

It is only necessary that the voltage applying portion 82, as described in the first embodiment, and the fourth through sixth embodiments, has a function of applying different voltages Vsub to the P-type semiconductor region 16, when any one of programming, erasing, and reading different data is performed on the memory cell 80 having the charge storage region. Also, the voltages shown in Table 1 through table 4 are examples, and can be changed as needed according to the purpose.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 μA).

Figure 16:
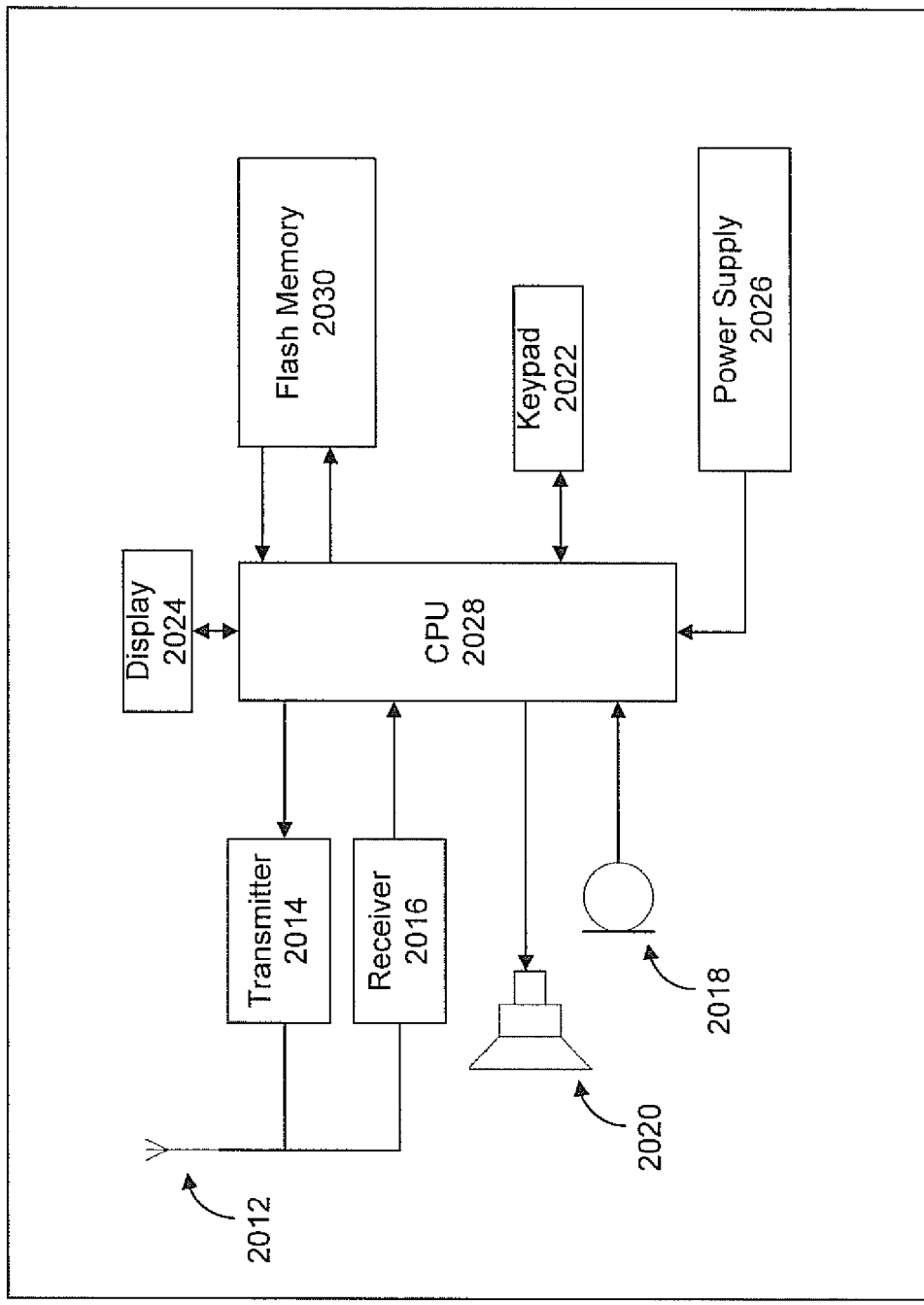
FIG. 16 illustrates a block diagram of a conventional portable phone, upon which embodiments can be implemented.

FIG. 16 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes an insulation layer provided on a semiconductor substrate; a p-type semiconductor region provided on the insulation layer; an isolation region provided that surrounds the p-type semiconductor region to reach the insulation layer; an n-type source region and an n-type drain region provided on the p-type semiconductor region; a charge storage region provided above the p-type semiconductor region between the n-type source region and the n-type drain region; and an voltage applying portion that applies a different voltage to the p-type semiconductor region while any of programming, erasing and reading a different data of a memory cell that has the charge storage region is being preformed.

In the conventional flash memory, the Vth of the transistor has to be strictly controlled in writing and reading data. Unless adjacent distributions of Vths are completely separated from each other, a malfunction occurs. Yet, as the memory size becomes smaller, Vth is more sensitive to the charge amount accumulated. Therefore, it is not easy to control Vth.

In contrast to conventional approaches, the present invention has been made in view of the above circumstances and provides a control method that can perform Vth control of the transistor included in the memory cell. As a result, a flash memory is able to function more effectively. This increase in flash memory efficiency translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 17:
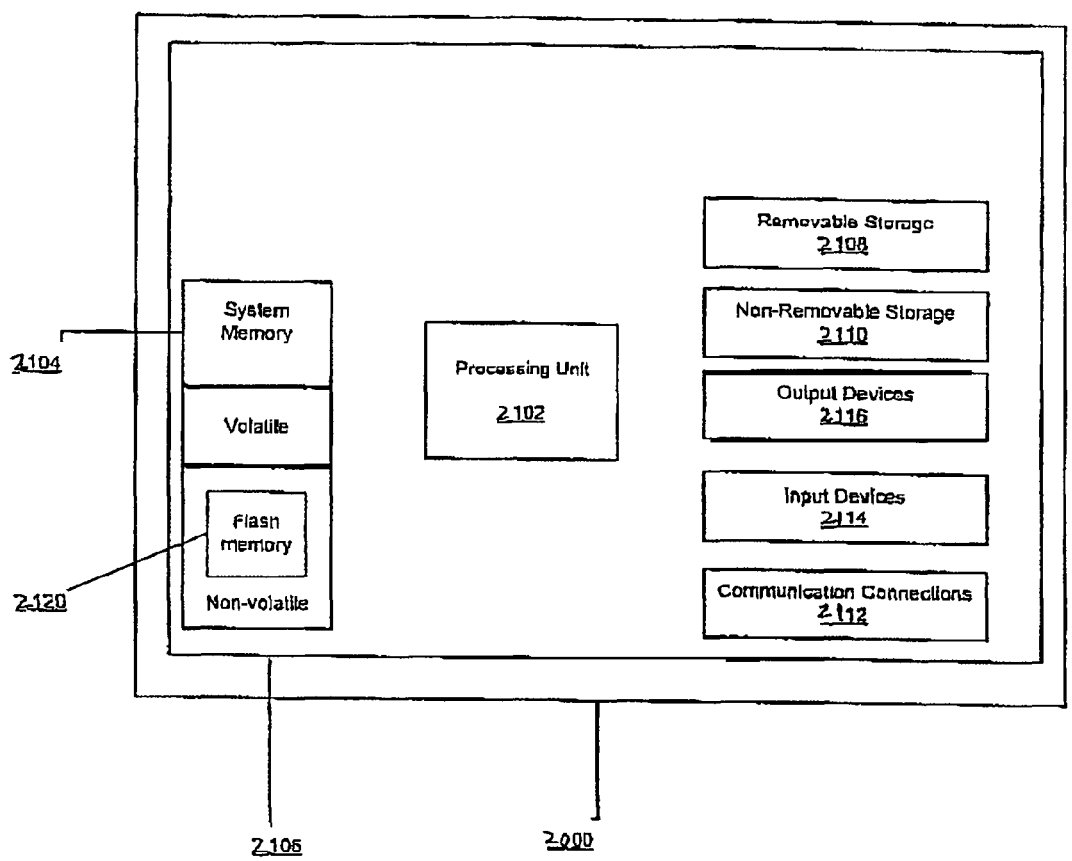
FIG. 17 illustrates a block diagram of a computing device, upon which embodiments of the present claimed subject matter can be implemented.

FIG. 17 illustrates a block diagram of a computing device 2100, upon which embodiments of the present claimed subject matter can be implemented. Although computing device 2100 is shown and described in FIG. 17 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing unit 2100 can include additional components not shown in FIG. 17.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 17 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 17 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: an insulation layer provided on a semiconductor substrate; a p-type semiconductor region provided on the insulation layer; an isolation region provided that surrounds the p-type semiconductor region to reach the insulation layer; an n-type source region and an n-type drain region provided on the p-type semiconductor region; a charge storage region provided above the p-type semiconductor region between the n-type source region and the n-type drain region; and an voltage applying portion that applies a different voltage to the p-type semiconductor region while any of programming, erasing and reading a different data of a memory cell that has the charge storage region is being preformed.

In the conventional flash memory, the Vth of the transistor has to be strictly controlled in writing and reading data. Unless adjacent distributions of Vths are completely separated from each other, a malfunction occurs. Yet, as the memory size becomes smaller, Vth is more sensitive to the charge amount accumulated. Therefore, it is not easy to control Vth.

In contrast to conventional approaches, the present invention has been made in view of the above circumstances and provides a control method that can perform Vth control of the transistor included in the memory cell. As a result, a flash memory is able to function more effectively. This increase in flash memory efficiency translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 18:
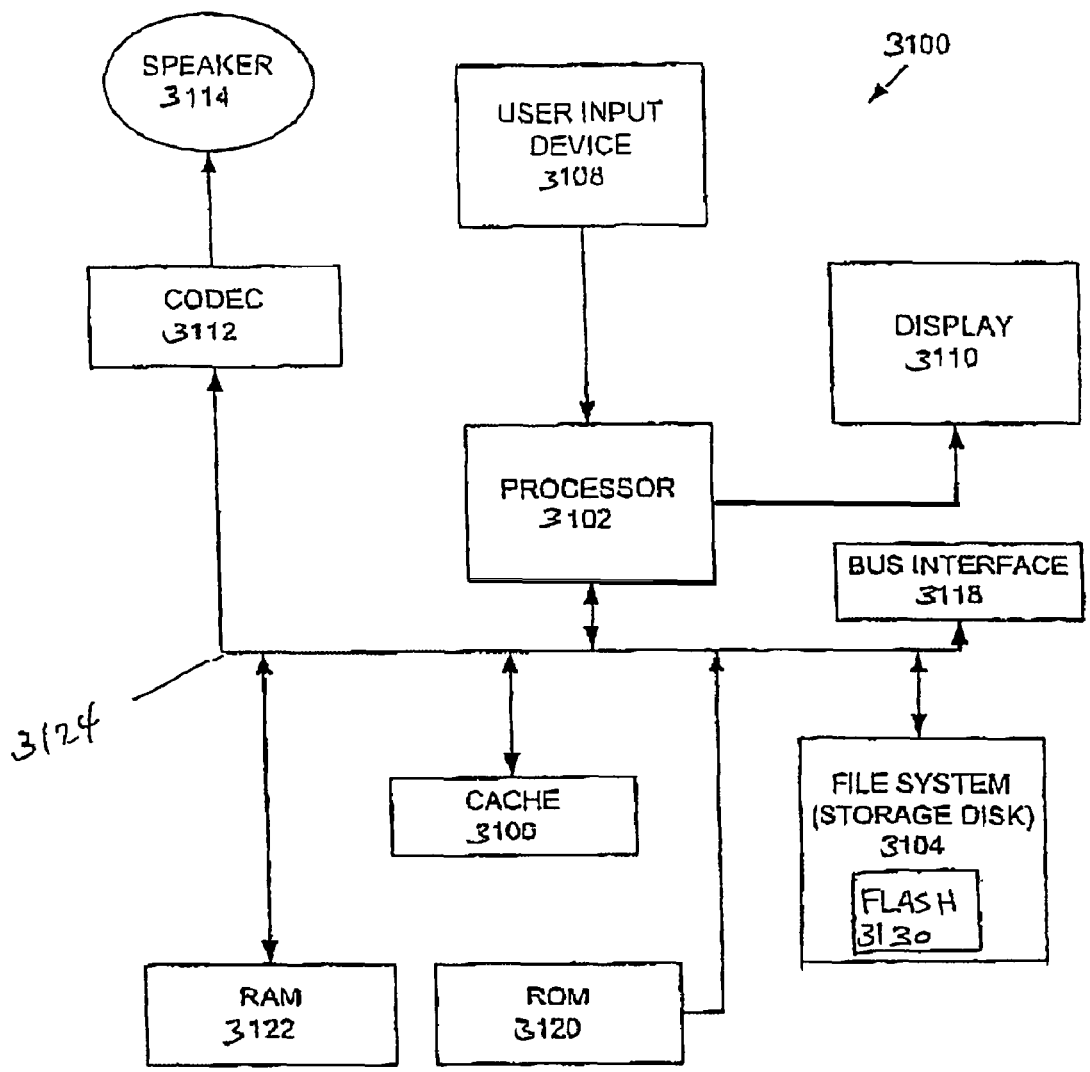
FIG. 18 illustrates an exemplary portable multimedia device, or media player, in accordance with an embodiment of the invention.

FIG. 18 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: an insulation layer provided on a semiconductor substrate; a p-type semiconductor region provided on the insulation layer; an isolation region provided that surrounds the p-type semiconductor region to reach the insulation layer; an n-type source region and an n-type drain region provided on the p-type semiconductor region; a charge storage region provided above the p-type semiconductor region between the n-type source region and the n-type drain region; and an voltage applying portion that applies a different voltage to the p-type semiconductor region while any of programming, erasing and reading a different data of a memory cell that has the charge storage region is being preformed.

In the conventional flash memory, the Vth of the transistor has to be strictly controlled in writing and reading data. Unless adjacent distributions of Vths are completely separated from each other, a malfunction occurs. Yet, as the memory size becomes smaller, Vth is more sensitive to the charge amount accumulated. Therefore, it is not easy to control Vth.

In contrast to conventional approaches, the present invention has been made in view of the above circumstances and provides a control method that can perform Vth control of the transistor included in the memory cell. As a result, a flash memory is able to function more effectively. This increase in flash memory efficiency translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, various aspects of the present invention are summarized in the following.

According to a first aspect of the present invention, there is preferably provided a semiconductor device including: an insulation layer provided on a semiconductor substrate; a p-type semiconductor region provided on the insulation layer; an isolation region provided that surrounds the p-type semiconductor region to reach the insulation layer; an n-type source region and an n-type drain region provided on the p-type semiconductor region; a charge storage region provided above the p-type semiconductor region between the n-type source region and the n-type drain region; and an voltage applying portion that applies a different voltage to the p-type semiconductor region while any of programming, erasing and reading a different data of a memory cell that has the charge storage region is being preformed.

In the above-described semiconductor device, four or more charge states can be programmed in the charge storage region; and the voltage applying portion may apply a different voltage to the p-type semiconductor region to program a different charge state. According to an aspect of the present invention, it is possible to control Vth of the transistor that composes the memory cell, in a flash memory in which multiple values can be stored in a memory cell.

In the above-described semiconductor device, the voltage applying portion may apply a first voltage to the p-type semiconductor region in a first period while a charge is being written into the charge storage region, and may apply a second voltage, higher than the first voltage, to the p-type semiconductor region in a second period while the charge is being written into the charge storage region after the first period. According to an aspect of the present invention, it is possible to narrow the Vth distribution at the time of programming.

In the above-described semiconductor device, the voltage applying portion may apply a first voltage to the p-type semiconductor region in a first period while a charge is being erased from the charge storage region, and may apply a second voltage, lower than the first voltage, to the p-type semiconductor region in a second period while the charge is being erased from the charge storage region after the first period. According to an aspect of the present invention, it is possible to narrow the Vth distribution at the time of erasing.

In the above-described semiconductor device, the voltage applying portion may apply an identical voltage in the first period and in the second period to a source, a control gate, and a drain of the memory cell. According to an aspect of the present invention, it is possible to simplify the control at the time of programming and erasing.

In the above-described semiconductor device, the memory cell may be a reference cell; and the voltage applying portion may apply a different voltage to the p-type semiconductor region to read different data from the reference cell. According to an aspect of the present invention, it is possible to reduce the number of the reference cells.

In the above-described semiconductor device, the isolation region may include an oxide silicon region or an n-type semiconductor region. According to an aspect of the present invention, the surrounding of the P-type semiconductor region can be isolated with certainty.

According to a second aspect of the present invention, there is preferably provided a semiconductor device including: an insulation layer provided on a semiconductor substrate; a p-type semiconductor region provided on the insulation layer; an isolation region that surrounds the p-type semiconductor region to reach the insulation layer, and that includes an oxide silicon region and an n-type semiconductor region; an n-type drain region provided on the p-type semiconductor region; an n-type source region provided on the p-type semiconductor region and on the n-type semiconductor region; and a charge storage region provided above the p-type semiconductor region between the n-type source region and the n-type drain region.

In the above-described semiconductor device, the charge storage region may include a floating gate. According to an aspect of the present invention, it is possible to control Vth of the transistor that composes the memory cell in a flash memory having floating gates in which multiple values can be stored in a memory cell.

In the above-described semiconductor device, the charge storage region may include a trap layer of an ONO film. According to an aspect of the present invention, it is possible to control Vth of the transistor that composes the memory cell in a flash memory having ONO films in which multiple values can be stored in a memory cell.

According to a third aspect of the present invention, there is preferably provided a method of controlling a semiconductor device having an insulation layer provided on a semiconductor substrate; a p-type semiconductor region provided on the insulation layer; an isolation region provided that surrounds the p-type semiconductor region to reach the insulation layer; an n-type source region and an n-type drain region provided on the p-type semiconductor region; a charge storage region provided above the p-type semiconductor region between the n-type source region and the n-type drain region, the method of controlling the semiconductor device including the steps of: applying a first voltage to the p-type semiconductor region while any of programming, erasing, and reading of a memory cell having the charge storage region is being performed; and applying a second voltage, different from the first voltage, to the p-type semiconductor region while said any of programming, erasing, and reading of the memory cell is being performed.

In the above-described method, the step of applying the first voltage may include a step of writing a charge into the charge storage region; and the step of applying the second voltage, lower than the first voltage, may include a step of writing the charge into the charge storage region. According to an aspect of the present invention, it is possible to control Vth of the transistor that composes the memory cell in a flash memory in which multiple values are stored in a memory cell.

The above-described method may further include the steps of: applying a third voltage to the p-type semiconductor region to erase the charge from the charge storage region; and applying a fourth voltage, lower than the third voltage, to the p-type semiconductor region to erase the charge from the charge storage region. According to an aspect of the present invention, two program states having different Vth distributions with ease.

In the above-described method, a difference between the first voltage and the third voltage may be substantially identical to that between the second voltage and the fourth voltage. According to an aspect of the present invention, two erase states having different Vth distributions with ease.

In the above-described method, a fourth voltage is between the first voltage and the third voltage. According to an aspect of the present invention, two program states having different Vth distributions with ease.

The above-described method may further include a step of applying a fifth voltage to the p-type semiconductor region to read a charge state in the charge storage region. According to an aspect of the present invention, multi-level data can be stored in one memory cell.

In the above-described method, the fifth voltage may be substantially identical to the first voltage. According to an aspect of the present invention, the number of the voltages to be applied can be reduced.

In the above-described method, the step of applying the first voltage may include a step of applying the first voltage in a first period while a charge is being written into the charge storage region; and the step of applying the second voltage may include a step of applying the second voltage, higher than the first voltage, in a second period while the charge is being written into the charge storage region after the first period. According to an aspect of the present invention, it is possible to narrow the Vth distribution at the time of programming.

In the above-described method, the step of applying the first voltage may include a step of applying the first voltage in a first period while a charge is being erased from the charge storage region; and the step of applying the second voltage may include a step of applying the second voltage, lower than the first voltage, in a second period while the charge is being erased from the charge storage region after the first period. According to an aspect of the present invention, it is possible to narrow the Vth distribution at the time of erasing.

In the above-described method, the memory cell may be a reference cell; the step of applying the first voltage may include a step of reading data from the reference cell; and the step of applying the second voltage may include a step of reading the data from the reference cell. According to an aspect of the present invention, the number of the reference cells can be reduced.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A semiconductor device comprising:
an insulation layer provided on a semiconductor substrate;
two or more p-type semiconductor regions comprising a first p-type semiconductor region and other p-type semiconductor regions provided on the insulation layer;
a trench oxide film provided that surrounds each of the two or more p-type semiconductor regions to reach the insulation layer, wherein the trench oxide film isolates any two of the two or more p-type semiconductor regions from each other, and wherein the trench oxide film is a single contiguous film;
an n-type source region and an n-type drain region provided on the first p-type semiconductor region; and
a charge storage region provided above the first p-type semiconductor region between the n-type source region and the n-type drain region, wherein the charge storage region has a plurality of charge states for a memory cell.

2. The semiconductor device as claimed in claim 1, wherein four or more charge states can be programmed in the charge storage region; and
wherein a voltage applying portion applies a different voltage to the first p-type semiconductor region to program a different charge state.

3. The semiconductor device as claimed in claim 2, wherein the voltage applying portion applies a first voltage to the first p-type semiconductor region in a first period while a charge is being written into the charge storage region, and applies a second voltage, higher than the first voltage, to the first p-type semiconductor region in a second period while the charge is being written into the charge storage region after the first period.

4. The semiconductor device as claimed in claim 2 wherein the voltage applying portion applies a first voltage to the first p-type semiconductor region in a first period while a charge is being erased from the charge storage region, and applies a second voltage, lower than the first voltage, to the first p-type semiconductor region in a second period while the charge is being erased from the charge storage region after the first period.

5. The semiconductor device as claimed in claim 3, wherein the voltage applying portion applies an identical voltage in the first period and in the second period to a source, a control gate, and a drain of the memory cell.

6. The semiconductor device as claimed in claim 1, wherein the memory cell is a reference cell; and
wherein a voltage applying portion applies a different voltage to the first p-type semiconductor region to read different data from the reference cell.

7. The semiconductor device as claimed in claim 1, wherein the trench oxide film includes an oxide silicon region or an n-type semiconductor region.

8. A semiconductor device comprising:
an insulation layer provided on a semiconductor substrate;
a first p-type semiconductor region provided on the insulation layer;
an isolation region that surrounds the first p-type semiconductor region to reach the insulation layer and that includes an oxide silicon region and an n-type semiconductor region, wherein the isolation region isolates the p-type semiconductor region from other p-type semiconductor regions, wherein the isolation region individually surrounds each of the other p-type semiconductor regions and the first p-type semiconductor region, and wherein a portion of the oxide silicon region is in contact with a plurality of individually isolated p-type semiconductor regions;
an n-type drain region provided on the first p-type semiconductor region, wherein the oxide silicon region is provided alongside the drain region;
an n-type source region provided on the first p-type semiconductor region and on the n-type semiconductor region, wherein the n-type semiconductor region is provided alongside the source region;

a charge storage region provided above the first p-type semiconductor region between the n-type source region and the n-type drain region; and a voltage applying portion, wherein the voltage applying portion generates and communicates a different voltage to the first p-type semiconductor region while any of programming, erasing and reading a different data of a memory cell that has the charge storage region is being performed.

9. The semiconductor device as claimed in claim 7, wherein the charge storage region includes a floating gate.

10. The semiconductor device as claimed in claim 7, wherein the charge storage region includes a trap layer of an ONO film.

11. A wireless communications device, said wireless communications device comprising:
- a flash memory comprising:
  - an insulation layer provided on a semiconductor substrate;
  - two or more p-type semiconductor regions comprising a first p-type semiconductor region and other p-type semiconductor regions provided on the insulation layer;
  - a trench oxide film provided that surrounds each of the two or more p-type semiconductor regions to reach the insulation layer, wherein the trench oxide film isolates any two of the two or more p-type semiconductor regions from each other, and wherein the trench oxide film is a single contiguous film;
  - an n-type source region and an n-type drain region provided on the first p-type semiconductor region; and
  - a charge storage region provided above the first p-type semiconductor region between the n-type source region end the n-type drain region, wherein the charge storage region has a plurality of charge states;
- a processor;
- a communications component;
- a transmitter;
- a receiver; and
- an antenna connected to the transmitter circuit and the receiver circuit.

12. The wireless communications device of claim 11, wherein said flash memory is NAND flash memory.

13. The wireless communications device of claim 11, wherein said flash memory is NOR flesh memory.

14. The wireless communications device of claim 11, wherein said flash memory utilizes mirrorbits technology.

15. A computing device comprising:
- a processor;
- an input component;
- an output component;
- a memory comprising:
  - a volatile memory; and
  - a flash memory comprising:
    - an insulation layer provided on a semiconductor substrate;
    - two or more p-type semiconductor regions comprising a first p-type semiconductor region and other p-type semiconductor regions provided on the insulation layer;
    - a trench oxide film provided that surrounds each of the two or more p-type semiconductor regions to reach the insulation layer, wherein the trench oxide film isolates any two of the two or more p-type semiconductor regions from each other, and wherein the trench oxide film is a single contiguous film;
    - an n-type source region and an n-type drain region provided on the first p-type semiconductor region; and
    - a charge storage region provided above the first p-type semiconductor region between the n-type source region and the n-type drain region, wherein the charge storage region has a plurality of charge states.

16. The computing device of claim 15, wherein said computing device is a personal computer (PC).

17. The computing device of claim 15, wherein said computing device is a personal digital assistant (PDA).

18. The computing device of claim 15, wherein said computing device is a gaming system.

19. A portable media player comprising:
- a processor;
- a cache;
- a user input component;
- a coder-decoder component; and
- a memory comprising:
  - a flash memory comprising:
    - an insulation layer provided on a semiconductor substrate;
    - two or more p-type semiconductor regions comprising a first p-type semiconductor region and other p-type semiconductor regions provided on the insulation layer;
    - a trench oxide film provided that surrounds each of the two or more p-type semiconductor regions to reach the insulation layer, wherein the trench oxide film isolates any two of the two or more p-type semiconductor regions from each other, and wherein the trench oxide film is a single contiguous film;
    - an n-type source region and an n-type drain region provided on the first p-type semiconductor region; and
    - a charge storage region provided above the first p-type semiconductor region between the n-type source region and the n-type drain region, wherein the charge storage region has a plurality of charge states.

20. The portable media player of claim 19, wherein said portable media player is a portable music player.

21. The portable media player of claim 19, wherein said portable media player is a portable video player.

* * * * *